US007190335B2

(12) United States Patent
Yamazaki et al.

(10) Patent No.: US 7,190,335 B2
(45) Date of Patent: Mar. 13, 2007

(54) LIGHT EMITTING DEVICE AND METHOD OF MANUFACTURING THE SAME

(75) Inventors: Shunpei Yamazaki, Tokyo (JP); Masakazu Murakami, Atsugi-Kanagawa (JP); Satoshi Seo, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 505 days.

(21) Appl. No.: 10/395,330

(22) Filed: Mar. 25, 2003

(65) Prior Publication Data

US 2003/0184217 A1  Oct. 2, 2003

(30) Foreign Application Priority Data

Mar. 26, 2002 (JP) ............................. 2002-087221

(51) Int. Cl.
G09G 3/30 (2006.01)
G09G 3/10 (2006.01)
(52) U.S. Cl. ..................... 345/76; 345/80; 315/169.3
(58) Field of Classification Search .......... 345/55–100; 349/139–152, 66; 439/55–91; 315/169.1–169.4
See application file for complete search history.

(56) References Cited

U.S. PATENT DOCUMENTS 4,356,429 A  10/1982 Tang (Continued)

FOREIGN PATENT DOCUMENTS

EP  0 717 445 A2  6/1996

(Continued)

OTHER PUBLICATIONS

Teruo Thoma, "Development of Organic El Display using Small Molecule Material", The 10th international workshop on inorganic and organic electroluminescence, Dec. 4-7, 2000, pp. 9-13.

(Continued)

Primary Examiner—Bipin Shalwala
Assistant Examiner—David L. Lewis
(74) Attorney, Agent, or Firm—Nixon Peabody LLP; Jeffrey L. Costellia

(57) ABSTRACT

An ink jet method known as a method for selectively forming a layer made of a polymeric organic compound is advantageous in that a layer containing an organic compound can be separately colored for emitting light of three colors (R, G, B) at a time. However, this ink jet method is disadvantageous in its poor film formation accuracy, and therefore, it is difficult to control the formation of the film for obtaining the uniformity. As a result, the obtained film is likely to have unevenness. In the present invention, an layer containing an organic compound is formed on the entire surface of a lower electrode connected to a thin film transistor by application. After forming an upper electrode on the lower electrode, an layer containing an organic compound is etched in a self-aligned manner by plasma etching using the upper electrode as a mask so as to allow the selective formation of an layer containing an organic compound. Furthermore, for connection with the upper electrode, the electrical connection is achieved by using an adhesive containing a conductive particle or a paste. Furthermore, a material emitting white light or a material emitting monochromatic light is used as the layer containing an organic compound. The full-color display is achieved by combining the layer containing an organic compound with a color conversion layer or a colored layer.

55 Claims, 20 Drawing Sheets

U.S. PATENT DOCUMENTS

| | | | |
|---|---|---|---|
| 4,411,735 A | 10/1983 | Belani | |
| 4,539,507 A | 9/1985 | VanSlyke et al. | |
| 4,720,432 A | 1/1988 | VanSlyke et al. | |
| 4,769,292 A | 9/1988 | Tang et al. | |
| 4,885,211 A | 12/1989 | Tang et al. | |
| 4,950,950 A | 8/1990 | Perry et al. | |
| 5,047,687 A | 9/1991 | VanSlyke | |
| 5,059,861 A | 10/1991 | Littman et al. | |
| 5,059,862 A | 10/1991 | VanSlyke et al. | |
| 5,061,617 A | 10/1991 | Maskasky | |
| 5,063,327 A | 11/1991 | Brodie et al. | |
| 5,073,446 A | 12/1991 | Scozzafava et al. | |
| 5,130,833 A | 7/1992 | Mase | |
| 5,151,629 A | 9/1992 | VanSlyke | |
| 5,232,549 A | 8/1993 | Cathey et al. | |
| 5,294,869 A | 3/1994 | Tang et al. | |
| 5,294,870 A | 3/1994 | Tang et al. | |
| 5,640,067 A | 6/1997 | Yamauchi et al. | |
| 5,684,365 A | 11/1997 | Tang et al. | |
| 5,710,612 A | 1/1998 | Mase | |
| 5,839,456 A | 11/1998 | Han | |
| 5,962,962 A | 10/1999 | Fujita et al. | |
| 6,037,712 A | 3/2000 | Codama et al. | |
| 6,057,900 A * | 5/2000 | Ono et al. | 349/110 |
| 6,072,450 A | 6/2000 | Yamada et al. | |
| 6,107,158 A | 8/2000 | Zheng et al. | |
| 6,175,345 B1 * | 1/2001 | Kuribayashi et al. | 345/76 |
| 6,362,866 B1 | 3/2002 | Yamazaki et al. | |
| 6,373,455 B1 | 4/2002 | Kuribayashi et al. | |
| 6,403,289 B1 | 6/2002 | Tanaka et al. | |
| 6,404,476 B1 | 6/2002 | Mase | |
| 6,420,834 B2 | 7/2002 | Yamazaki et al. | |
| 6,439,898 B2 * | 8/2002 | Chua et al. | 439/81 |
| 6,444,899 B2 | 9/2002 | Kubota et al. | |
| 6,475,836 B1 | 11/2002 | Suzawa et al. | |
| 6,528,951 B2 | 3/2003 | Yamazaki et al. | |
| 6,593,691 B2 | 7/2003 | Nishi et al. | |
| 6,657,260 B2 * | 12/2003 | Yamazaki et al. | 257/350 |
| 6,692,845 B2 | 2/2004 | Maruyama et al. | |
| 6,739,931 B2 | 5/2004 | Yamazaki et al. | |
| 6,774,574 B1 | 8/2004 | Koyama | |
| 6,777,887 B2 | 8/2004 | Koyama | |
| 6,781,152 B2 | 8/2004 | Yamazaki | |
| 6,900,873 B2 | 5/2005 | Yamazaki et al. | |
| 6,956,635 B2 | 10/2005 | Mase | |
| 2001/0041270 A1 | 11/2001 | Maruyama et al. | |
| 2001/0043291 A1 * | 11/2001 | Kono et al. | 349/12 |
| 2002/0005696 A1 | 1/2002 | Yamazaki et al. | |
| 2002/0015818 A1 | 2/2002 | Takahashi et al. | |
| 2002/0074936 A1 | 6/2002 | Yamazaki et al. | |
| 2002/0158835 A1 | 10/2002 | Kobayashi et al. | |
| 2003/0016715 A1 * | 1/2003 | Furukawa et al. | 372/50 |
| 2003/0132716 A1 | 7/2003 | Yamazaki et al. | |
| 2003/0137325 A1 | 7/2003 | Yamazaki et al. | |
| 2003/0162314 A1 | 8/2003 | Yamazaki et al. | |
| 2003/0222575 A1 | 12/2003 | Yamazaki et al. | |
| 2004/0156982 A1 | 8/2004 | Maruyama et al. | |
| 2005/0042796 A1 * | 2/2005 | Wagner | 438/65 |
| 2005/0157242 A1 | 7/2005 | Yamazaki et al. | |
| 2005/0231107 A1 * | 10/2005 | Yamazaki et al. | 313/506 |

FOREIGN PATENT DOCUMENTS

| | | |
|---|---|---|
| EP | 1 168 291 A2 | 1/2002 |
| JP | 2001-351787 A | 12/2001 |
| JP | 2002-324966 | 11/2002 |

OTHER PUBLICATIONS

M.A. Baldo et al., "Very High-Efficiency Green Organic Light-Emitting Devices Based on Electrophosphorescence", Applied Physics Letters, vol. 75, No. 1., Jul. 5, 1999, pp. 4-6.

Tetsuo Tsutsui, et al. "High Quantum Efficiency in Organic Light-Emitting Devices with Iridium-Complex as a Triplet Emissive Center", Japanese Journal of Applied Physics, vol. 38/Part 2, No. 12B, Dec. 15, 1999, pp. L1502-L1504.

M.A. Baldo et al., "Highly Efficient Phosphorescent Emission From Organic Electroluminescent Devices", Nature, vol. 395, Sep. 10, 1999, pp. 151-154.

Tetsuo Tsutsui et al., "Electroluminescence in Organic Thin Films", Photochemical Processes in Organized Molecular Systems, Sep. 22, 1990, pp. 437-450.

* cited by examiner

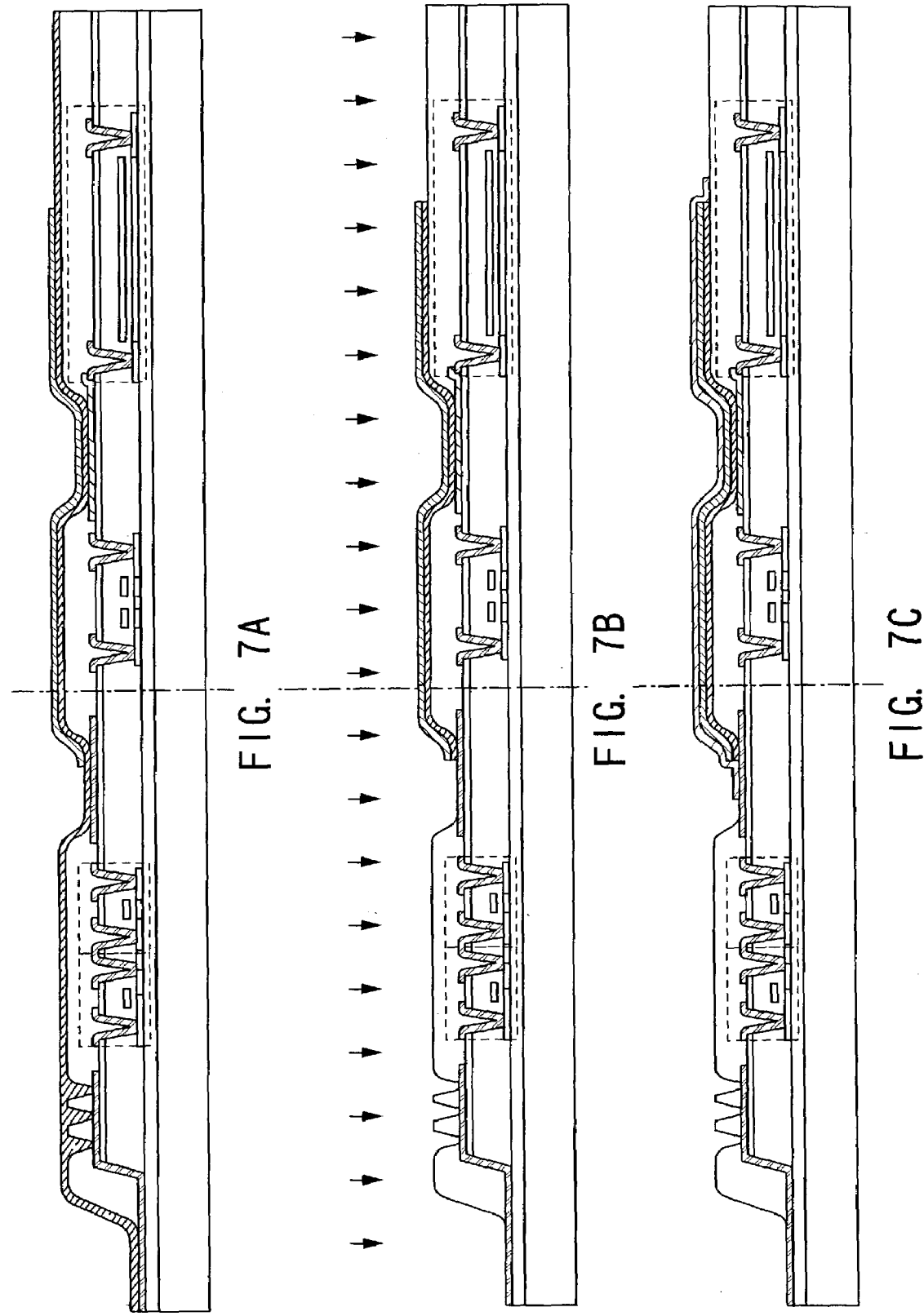

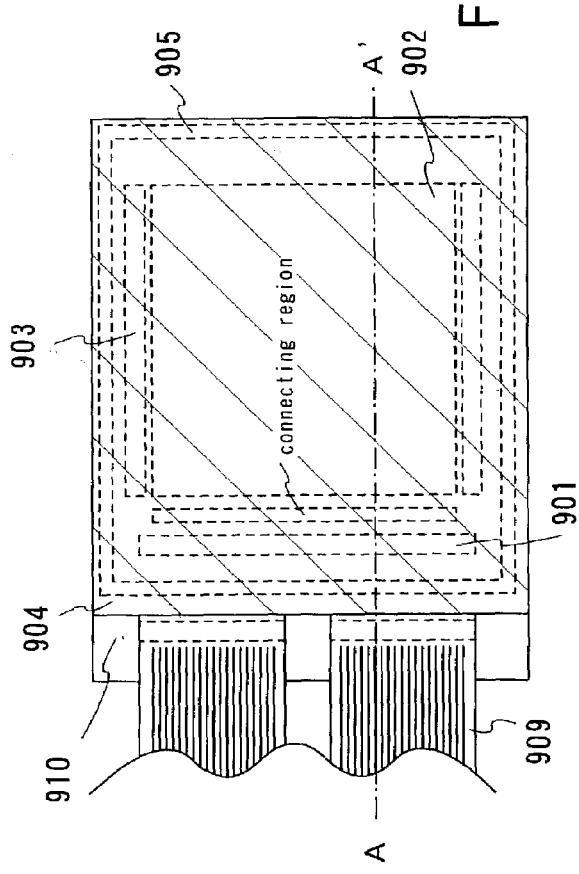
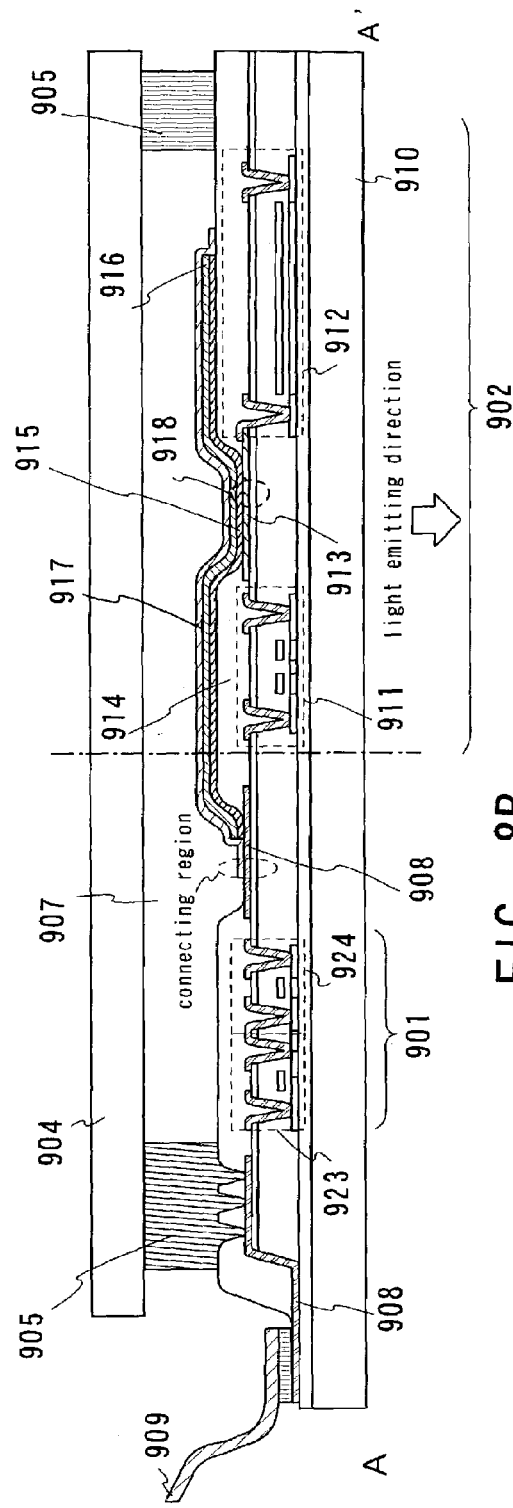
FIG. 8A
FIG. 8B

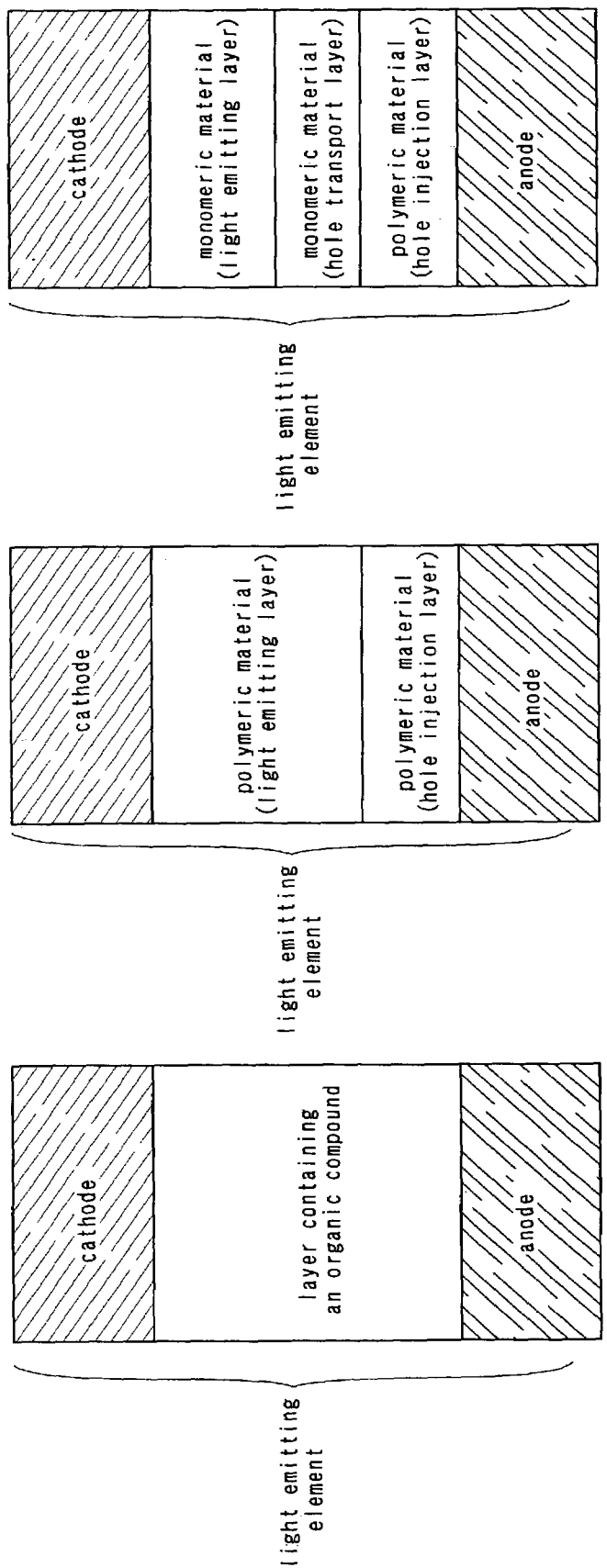

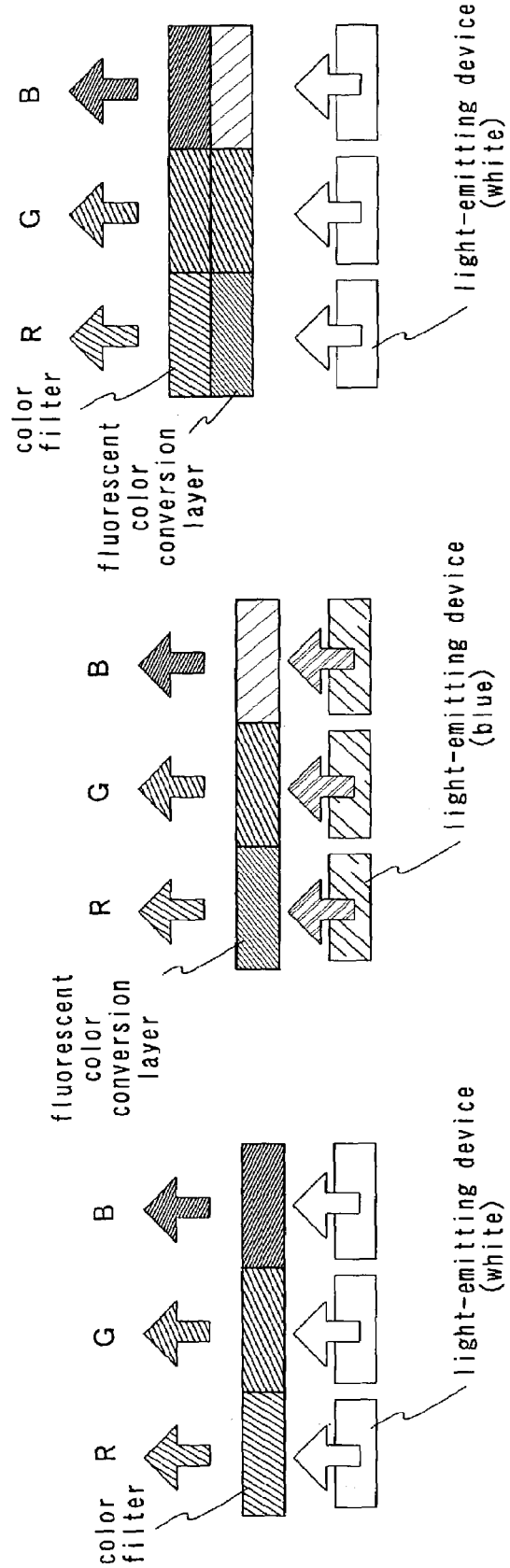

transmittance of each colored layers color reproducibility range as a chromaticity coordinate A-A' cross-sectional view B-B' cross-sectional view

LIGHT EMITTING DEVICE AND METHOD OF MANUFACTURING THE SAME

BACKGROUND OF THE INVENTION

1. Field of the Invention

The present invention relates to a light emitting device with a light emitting element that emits fluorescent light or phosphorescent light upon application of electric field to a pair of electrodes of the element which sandwich a layer containing an organic compound, and to a method of manufacturing the light emitting device. In this specification, the term light emitting device includes an image display device, a light emitting device and a light source (including illuminating device). Also, the following modules are included in the definition of the light emitting device: a module obtained by attaching to a light emitting element a connector such as an FPC (flexible printed circuit; terminal portion), a TAB (tape automated bonding) tape, or a TCP (tape carrier package); a module in which a printed wiring board is provided at an end of the TAB tape or the TCP; and a module in which an IC (integrated circuit) is directly mounted to a light emitting element by the COG (chip on glass) system.

2. Description of the Related Art

Light emitting elements, which employ organic compounds as light emitting member and are characterized by their thinness and light weight, fast response, and direct current low voltage driving, are expected to develop into next-generation flat panel displays. Among display devices, ones having light emitting elements arranged to form a matrix shape are considered to be particularly superior to the conventional liquid crystal display devices for their wide viewing angle and excellent visibility.

It is said that light emitting elements emit light through the following mechanism: a voltage is applied between a pair of electrodes that sandwich an layer containing an organic compound, electrons injected from the cathode and holes injected from the anode are re-combined at the luminescent center of the layer containing an organic compound to form molecular excitons, and the molecular excitons return to the base state while releasing energy to cause the light emitting element to emit light. Known as excitation states are singlet excitation and triplet excitation, and it is considered that luminescence can be conducted through either one of those excitation states.

Such light emitting devices having light emitting elements arranged to form a matrix can employ passive matrix driving (simple matrix light emitting devices), active matrix driving (active matrix light emitting devices), or other driving methods. However, if the pixel density is increased, active matrix light emitting devices in which each pixel (or each dot) has a switch are considered as advantageous because they can be driven with low voltage.

Organic compounds for forming an layer containing an organic compound (strictly speaking, light emitting layer), which is the center of a light emitting element, are classified into low molecular weight materials and polymeric (polymer) materials. Both types of materials are being studied but polymeric materials are the ones that are attracting attention because they are easier to handle and have higher heat resistance than low molecular weight materials.

Known methods for forming these organic compounds into films are, for example, an evaporation method, a spin coating method, and an ink jet method. The spin coating and the ink jet are particularly well known as methods that allow a light emitting device to display a full-color image using a polymeric material.

However, when the spin coating is used, the organic compounds are formed over an entire film forming surface and therefore, it is difficult to selectively form the film in which the organic compound is formed only at a portion intended to form the film and the film is not formed at the portion which is not necessary to form the film.

Further, the active matrix light emitting device is formed with a wiring for inputting an electric signal from an external power source to a driver circuit formed above a substrate, and a wiring for electrically connecting a light emitting element comprising a cathode, an anode and an layer containing an organic compound formed by an organic compound formed at a pixel portion with the external power source and therefore, when the organic compound is formed at the portions (terminal portions) of the wirings connected to the external power source, there poses a problem that ohmic contact cannot be achieved with external power source. Especially, when the layer containing an organic compound is formed by the spin coating method, it is difficult to lead out electrodes (cathode or anode) formed on the layer containing an organic compound to the terminal portions.

Therefore, the present invention provides a method for selectively forming a polymeric layer containing an organic compound and a connection structure for electrically connecting an electrode (a cathode or an anode) provided on the layer containing an organic compound to a wiring extending from a terminal portion.

An ink jet method, known as a method for selectively forming a polymeric organic compound film, is advantageous in that different organic compounds respectively emitting light of three colors (R, G, B) can be separately applied at a time. However, this method is disadvantageous in its poor film formation accuracy, and therefore it is difficult to control the formation of films so as to obtain the uniformity of the film. Thus, the obtained film is likely to have unevenness. The reasons for such unevenness in the ink jet method are, for example, unevenness in nozzle pitch, unevenness due to the ink jetted in a curved manner, low stage matching accuracy, a timing lag between the ink discharge and the stage movement, and the like. For example, this ink jet method has problems in implementation conditions such as a clogged nozzle for ink jet due to internal viscosity resistance of an ink produced by dissolving an organic compound in a solvent, an ink jetted out from a nozzle which fails to reach a desired position, as well as problems for practical use such as increased cost due to the necessity of a dedicated apparatus having a high precision stage or an automatic alignment mechanism, an ink head and the like. Moreover, since the ink is spread after reaching, a margin is required to a certain degree as a space between adjacent pixels. As a result, it becomes difficult to provide higher definition.

Therefore, in an active-matrix light emitting device using a polymeric organic compound, the present invention has an object of providing a method for selectively forming a polymeric material layer, which is simpler than in the case where the ink jet method is used; the present invention has another object of easily forming a structure in which an layer containing an organic compound is not formed at a junction of a wiring to be connected to an external power source.

A light emitting device conventionally has a problem in that external light (light exterior to the light emitting device) incident on non-light emitting pixels is reflected by a bottom face of a cathode (a face on the side being in contact with a light emitting layer), resulting in the bottom face of the cathode acting as a mirror. As a result, the exterior landscape is disadvantageously reflected on a viewing face (a surface facing a viewer side). In order to avoid this problem, it is devised that a circular polarization film is attached on a viewing face of the light emitting device so that the exterior landscape is not reflected on the viewing face. However, since the circular polarization film is extremely expensive, the manufacturing cost is disadvantageously increased.

SUMMARY OF THE INVENTION

In the present invention, a film made of a polymeric material is formed on the entire surface of a lower electrode (first electrode) by application, an upper electrode (second electrode) is formed by vapor deposition using a vapor deposition mask. Then, the film made of a polymeric material is etched in a self-aligned manner by plasma etching using the upper electrode as a mask, so that the selective formation of the polymeric material layer is allowed.

Furthermore, an auxiliary electrode (third electrode) is formed so that the upper electrode is connected to a wiring extending to a terminal electrode. Moreover, a thickness of the upper electrode may reduced as long as the upper electrode is resistant against a plasma etching process. In this case, the resistance may be reduced by the auxiliary electrode formed thereon. As the auxiliary electrode, a metal wiring made of a metal may be used, or an adhesive containing a conductive paste (a nanopaste, a hybrid paste, a nanometal ink and the like) or a conductive fine particle may be used.

A structure of the present invention disclosed in the present specification relates to, as shown in an example of FIGS. 1A and 1B, or FIGS. 22A and 22B, a light emitting device including:

a pixel portion including a plurality of light emitting elements, a driving circuit and a terminal portion, between a first substrate having an insulating surface and a second substrate having translucency, each of the light emitting elements including: a first electrode; a layer containing an organic compound provided on the first electrode so as to be in contact therewith; and a second electrode provided on the layer containing the organic compound so as to be in contact therewith, in which the terminal portion is placed on the first substrate so as to be positioned outside the second substrate; and the first substrate and the second substrate are bonded to each other through an adhesive in which plural kinds of conductive fine particles having different diameters are mixed, whereas the second electrode and a wiring from the terminal portion are electrically connected to each other.

Further, another structure of the present invention relates to, as shown in an example of FIGS. 1A and 1B, a light emitting device including:

a pixel portion including a plurality of light emitting elements, a driving circuit and a terminal portion, between a first substrate having an insulating surface and a second substrate having translucency, each of the light emitting elements including: a first electrode; a layer containing an organic compound provided on the first electrode so as to be in contact therewith; and a second electrode provided on the layer containing the organic compound so as to be in contact therewith, in which the terminal portion is placed on the first substrate so as to be positioned outside the second substrate; and the first substrate and the second substrate are bonded to each other through an adhesive in which a fine particle made of an inorganic material and a conductive fine particle having a larger diameter than that of the fine particle are mixed, whereas the second electrode and a wiring from the terminal portion are electrically connected to each other.

Further, another structure of the present invention relates to, as shown in an example of FIGS. 2A and 2B, or FIGS. 3A and 3B, a light emitting device including:

a pixel portion including a plurality of light emitting elements, each of the light emitting elements including: a first electrode; a layer containing an organic compound provided on the first electrode so as to be in contact therewith; and a second electrode provided on the layer containing the organic compound so as to be in contact therewith; and a terminal portion, in which an end face of the layer containing the organic compound is flush with that of the second electrode; and there is a portion where the second electrode and a wiring extending from the terminal portion are electrically connected through an adhesive containing a conductive fine particle, between the terminal portion and the pixel portion.

Further, another structure of the present invention relates to, as shown in an example of FIGS. 5A and 5B, a light emitting device including:

a pixel portion including a plurality of light emitting elements, each of the light emitting elements including: a first electrode; a layer containing an organic compound provided on the first electrode so as to be in contact therewith; and a second electrode provided on the layer containing the organic compound so as to be in contact therewith; and a terminal portion, in which an end face of the layer containing the organic compound is flush with that of the second electrode; and there is a portion where the second electrode and a wiring extending from the terminal portion are connected through a third electrode covering the second electrode, between the terminal portion and the pixel portion.

According to the above-mentioned structures of the present invention, the light emitting device is characterized in that the third electrode is made of a metal. Further, according to the above-mentioned structures, the second electrode and the third electrode are each one of an anode and a cathode of the light emitting element.

Further, in each of the above-mentioned structures of the present invention, the second electrode has the same pattern form as that of the layer containing the organic compound.

Further, in each of the above-mentioned structures of the present invention, the light emitting device is characterized in that the layer containing the organic compound is made of a polymeric material. Alternatively, in each of the above-mentioned structures, the layer containing the organic compound is a laminate layer composed of a layer made of a polymeric material and a layer made of a monomeric material.

Further, in each of the above-mentioned structures of the present invention, an end of the first electrode is covered with an insulator, and an upper end of the insulator includes a curved surface having a first curvature radius whereas a lower end of the insulator includes a curved surface having a second curvature radius, the first and second curvature radii being 0.2 to 3 μm.

Further, in each of the above-mentioned structures of the present invention, the first electrode is made of a material having translucency, and is one of an anode and a cathode of the light emitting element.

Further, in each of the above-mentioned structures of the present invention, the layer containing the organic compound is made of a material emitting white light, and is combined with a color filter. Alternatively, the layer containing the organic compound is made of a material emitting monochromatic light, and is combined with one of a color converting layer and a colored layer.

A structure of the present invention for realizing the above-mentioned structures of the present invention relates to, as shown in an example of FIGS. 4A to 4C, a method of manufacturing a light emitting device including a light emitting element having: an anode; a layer containing an organic compound in contact with the anode; and a cathode in contact with the layer containing the organic compound, including:

forming a layer containing an organic compound, made of a polymeric material, by application on a first electrode having translucency;

selectively forming a second electrode made of a metal on the film containing the organic compound by vapor deposition of heating a vapor deposition material;

etching the layer containing the organic compound in a self-aligned manner by plasma etching using the second electrode as a mask; and selectively forming a third electrode made of a metal so as to cover the second electrode.

Further, in the structure of the present invention concerning a manufacturing method, the second electrode and the third electrode are each one of an anode and a cathode. Also, according to the above-mentioned structure concerning the manufacturing method, the third electrode is formed by using any one of vapor deposition and sputtering.

Further, another structure of the invention concerning a manufacturing method relates to a method of manufacturing a light emitting device including a light emitting element having: an anode; a layer containing an organic compound in contact with the anode; and a cathode in contact with the layer containing the organic compound, including:

forming a layer containing an organic compound, made of a polymeric material, by application on a first electrode having translucency;

selectively forming a second electrode made of a metal on the film containing the organic compound by vapor deposition of heating a vapor deposition material;

etching the layer containing the organic compound in a self-aligned manner by plasma etching using the second electrode as a mask; and connecting the second electrode and a wiring extending from a terminal portion to each other through an adhesive containing a conductive particle.

Further, another structure of the invention concerning a manufacturing method relates to a method of manufacturing a light emitting device including a light emitting element having: an anode; a layer containing an organic compound in contact with the anode; and a cathode in contact with the layer containing the organic compound, including:

forming a thin film transistor on a first substrate;

forming a first electrode to be connected to the thin film transistor;

forming a layer containing an organic compound, made of a polymeric material, by application on the first electrode;

selectively forming a second electrode made of a metal on the film containing the organic compound by vapor deposition of heating a vapor deposition material;

etching the layer containing the organic compound in a self-aligned manner by plasma etching using the second electrode as a mask; and connecting the second electrode and a wiring extending from a terminal portion to each other through an adhesive containing a conductive particle, while bonding the first substrate and the second substrate to each other.

Further, in each of the above-mentioned structures concerning a manufacturing method, the manufacturing method is characterized in that the plasma is generated by exciting one or a plurality of gases selected from the group consisting of: Ar, H, F and O.

Further, in each of the above-mentioned structures concerning a manufacturing method, the first electrode is one of an anode and a cathode of the light emitting element electrically connected to a TFT.

Note that a light emitting element (EL element) has a layer, which contains an organic compound that provides luminescence (electroluminescence) when an electric field is applied (hereinafter referred to as EL layer), and an anode and a cathode. Although luminescence obtained from organic compounds is classified into light emission upon return to the base state from a singlet excitation (fluorescence), and light emission upon return to the base state from a triplet excitation (phosphorescence), it is possible to apply the light emitting device manufactured according to the present invention when using either type of light emission.

Further, in the light emitting device of the present invention, the driving method of the screen display is not specifically limited, and other methods such as a dot sequential driving method, a line sequential driving method, an area sequential driving method, and the like may also be used. Typically, there is adopted a line sequential driving method. Then, a typical line sequential driving method, a time division gradation driving method or an area gradation driving method may be used as appropriate. Further, the image signal inputted into the source line of the light emitting device may be an analog signal or a digital signal. Combined with an image signal, driving circuit or the like may be designed as appropriate.

Further, conductive paste may be performed with various coating methods (a screen printing method, a spin coating method, a dip coating method, etc.). Among them, nano-metal ink can be formed with an inkjet method.

BRIEF DESCRIPTION OF THE DRAWINGS

In the accompanying drawings:

FIGS. 7A to 7C are views showing manufacturing steps of Embodiment 1;

FIGS. 8A and 8B are a top view and a cross-sectional view of an active display device of Embodiment 1;

FIGS. 9A to 9C are views, each showing a laminate structure of a light emitting element in Embodiment 1;

FIGS. 10A to 10C are schematic views in the case where full-color display is achieved by using the emission of white light in Embodiment 1;

DESCRIPTION OF THE PREFERRED EMBODIMENTS

Hereinafter, embodiment modes of the present invention will be described with reference to the accompanying drawings.

(Embodiment Mode 1)

Figure 1A:
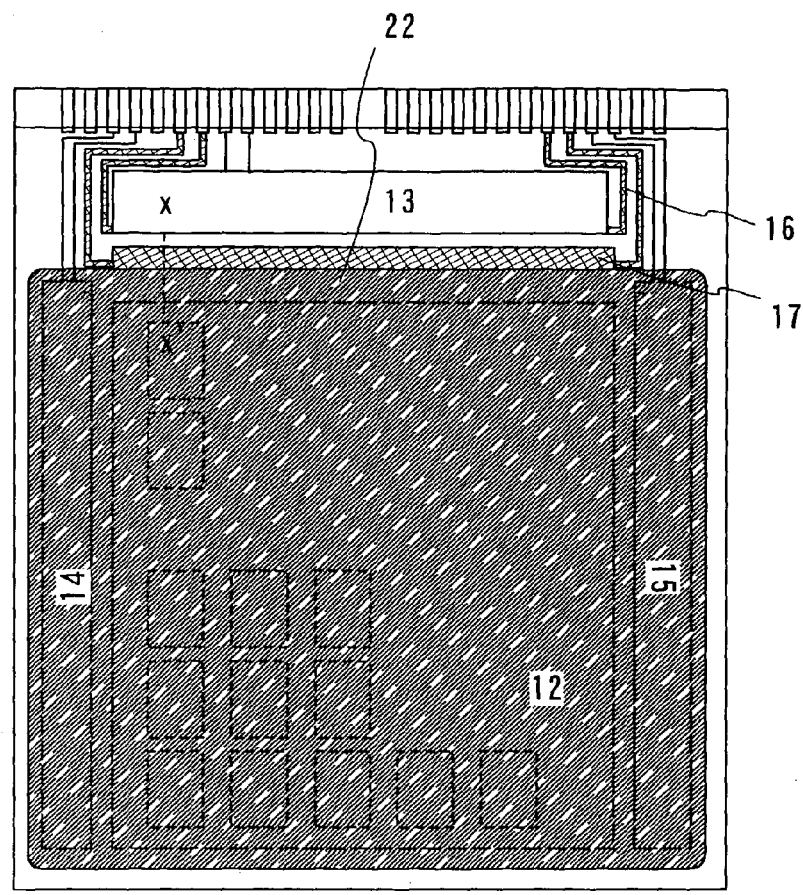
FIGS. 1A and 1B are a top view and a cross-sectional view showing Embodiment Mode 1, respectively.
Figure 1B:
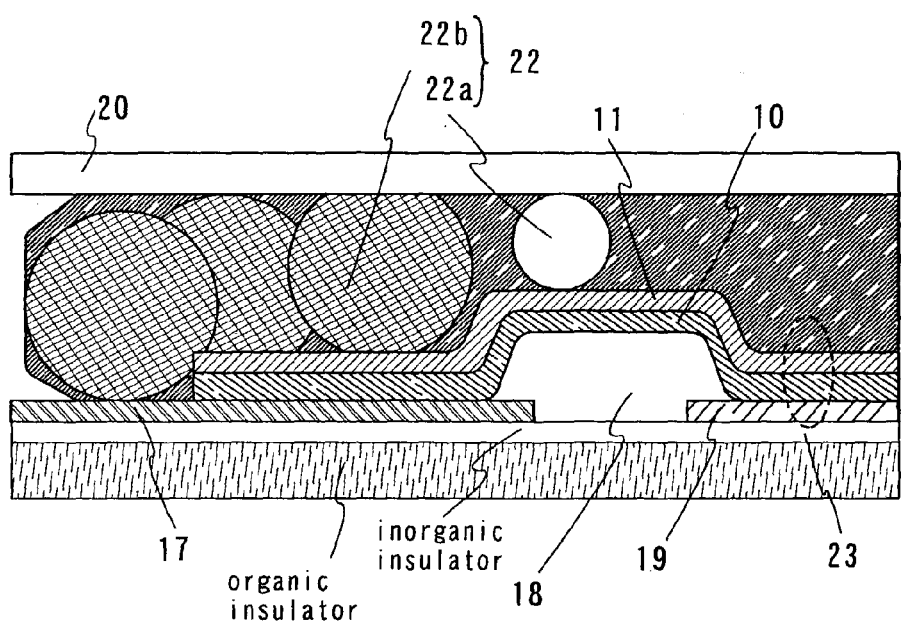

FIG. 1A is a top view showing an active-matrix light emitting device, and FIG. 1B is a cross-sectional view cut along a dotted line X–X' in FIG. 1A. In Embodiment Mode 1, a light emitting element 23 having a laminate structure made of a polymeric material that emits white light is described as an example.

In FIGS. 1A and 1B, a pixel portion 12 and driving circuits (gate-side driving circuits 14 and 15 and a source-side driving circuit 13) are formed on a substrate having an insulating surface. Each of the pixel portion 12 and the driving circuits 13 to 15 includes a plurality of TFTs (not shown). Each of the TFTs formed in the pixel portion 12 is an element for controlling a current flowing to a layer 10 containing an organic compound that emits light. A first electrode 19 or a power supply line 16 is connected to the TFTs in the pixel portion 12.

In the pixel portion 12, a plurality of light emitting elements 23 are placed; each of the light emitting elements 23 includes the first electrode 19, a second electrode 11 and a layer 10 containing an organic compound interposed therebetween. Moreover, the first electrodes 19 to be connected to each of the light emitting elements 23 are regularly placed in the pixel portion 12. The first electrode 19 is an anode (or a cathode) of the organic light emitting element, whereas the second electrode 11 is a cathode (or an anode) of the organic light emitting element. When a conductive material having translucency is used as the second electrode 11 and a metal is used as the first electrode 19, light emitted from the light emitting element 23 can be transmitted through a sealing material so as to be obtained therefrom. On the other hand, when a conductive material having translucency is used as the first electrode 19 and a metal is used as the second electrode 11, light can be obtained in an opposite direction. In the structure shown in FIGS. 1A and 1B, light can be obtained in either direction. In the case where light emitted from the light emitting element 23 is transmitted through the sealing material so as to be obtained, the sealing material 20 and an adhesive 22 having electrical conductivity have indispensably translucency.

The layer 10 containing an organic compound has a laminate structure. Typically, a laminate structure composed of: a hole transport layer/a light emitting layer/an electron transport layer, which is formed on an anode, can be cited as an example. Since this structure has an extremely high light emitting efficiency, most of the light emitting devices currently under investigation and development apply this structure. Alternatively, a laminate structure composed of: a hole injection layer/a hole transport layer/a light emitting layer/an electron transport layer, or a laminate structure composed of: a hole injection layer/a hole transport layer/a light emitting layer/an electron transport layer/an electron injection layer may also be used. Moreover, the light emitting layer may be doped with a fluorescent dye and the like. All these layers may be formed by using a monomeric material or by using a polymeric material. Throughout this specification, all the layers provided between the cathode and the anode are collectively referred to as a layer containing an organic compound (electroluminescence (EL) layer). Therefore, the above-described hole injection layer, hole transport layer, light emitting layer, electron transport layer and electron injection layer are all fall within the category of the EL layer. The layer containing an organic compound (EL layer) may contain an inorganic material such as silicon.

Both ends of the first electrode 19 and a portion between the ends of the first electrodes 19 are covered with an organic insulator 18 (also referred to as a barrier or a bank). Furthermore, the organic insulator 18 may be covered with an organic insulating film.

A terminal electrode is formed in a terminal portion which has a connection wiring 17 extending from the terminal electrode. The connection wiring 17 is electrically connected to the second electrode 11 through the adhesive 22 having electrical conductivity. Since the layer containing an organic compound is etched in a self-aligned manner using the second electrode 11 as a mask, an end face of the second electrode 11 and that of the layer 10 containing the organic compound are flush with each other. The adhesive 22 having electrical conductivity is provided so as to be in contact with the end faces. The conductive adhesive 22 contains a conductive fine particle 22b such as a silver particle or a copper particle and a spacer 22a. Furthermore, the sealing material 20 is adhered thereto so as to seal the light emitting element 23. Either a thermosetting resin or an ultraviolet curable resin may be used as the adhesive 22 having electrical conductivity. In the case where a thermosetting resin is used as the adhesive 22 having electrical conductivity, it is necessary to appropriately select a material having such a baking temperature that does not degrade the layer 10 containing an organic compound. In the case where the ultraviolet curable resin is used, it is necessary to use a material having translucency as a sealing material.

The spacer 22a may be made of an inorganic insulating material, an organic insulating material, or a combination thereof having different particle diameters. If an organic insulating film coated with a low-resistance metal film such as a gold film (for example, conductive fine particles obtained by uniformly gold-plating the surfaces of plastic fine particles having a uniform particle diameter) is used as the spacer 22a, it can be said that the spacer 22a serves as the conductive fine particle.

Figure 22A:
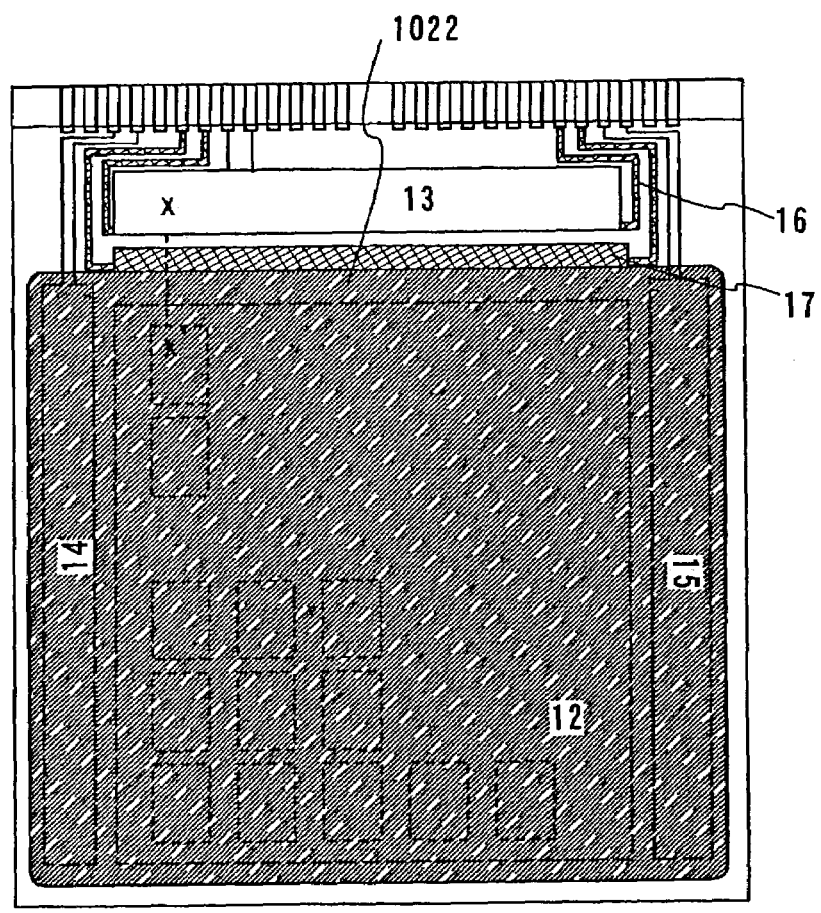
FIGS. 22A and 22B are a top view and a cross-sectional view showing Embodiment Mode 1.
Figure 22B:
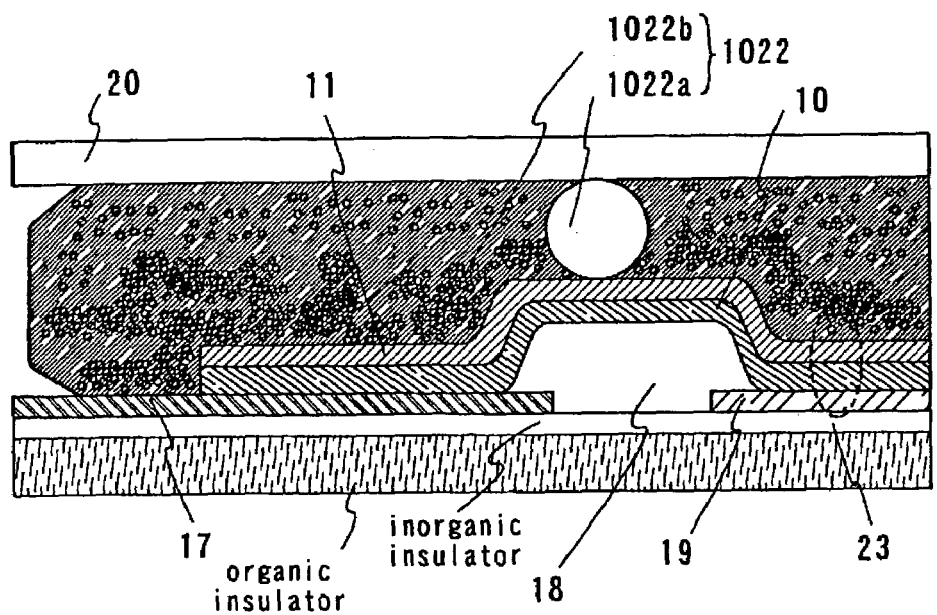

FIG. 1B shows an example where a diameter of the conductive fine particle 22b is larger than that of the spacer 22a. Alternatively, an organic material having elasticity coated with a metal film is used for a particle having a larger particle diameter, whereas an inorganic material is used for a particle having a smaller diameter. Upon contact bonding of the sealing material 20, the particle having a larger diameter is deformed so as to achieve the face contact. FIGS. 22A and 22B show an example where a diameter of a conductive fine particle 1022b is smaller than that of a spacer 1022a. In FIGS. 22A and 22B, it is sufficient that the conductive fine particles 1022b are present at a junction between the second electrode 11 and the connection wiring 17 for electrical connection. Therefore, it is not necessary to uniformly distribute the conductive particles 1022b in the adhesive 1022 having electrical conductivity; it is sufficient that the conductive particles 1022b are present in the vicinity of the second electrode 11 or the connection wiring 17 at a high density due to gravity.

The use of the adhesive 22 having electrical conductivity simultaneously allows the sealing of the light emitting element 23 by adhering the sealing material 20 and the electrical connection between the connection wiring 17 and the second electrode 11, thereby improving a throughput.

Although FIGS. 1A and 1B show the example where the adhesive 22 having electrical conductivity is entirely formed over the pixel portion, the formation of the adhesive 22 is not limited thereto. The adhesive 22 may also be formed in a partial manner. Also, the adhesive 22 may be a laminate of a material layer containing a conductive fine particle such as a silver paste, a copper paste, a gold paste or a Pd paste and an adhesive containing a spacer or a filler. In the case where the adhesive 22 has such a laminate structure, the connection wiring 17 and the second electrode 11 are first electrically connected to each other by forming the material layer containing a conductive fine particle. Thereafter, the sealing material 20 is adhered by using an adhesive containing a spacer or a filler to seal the light emitting element 23.

The sealing material 20 is bonded by a spacer or a filler so as to maintain a distance of about 2 to 30 µm. In this manner, all the light emitting elements are closely sealed. Although not shown in the drawings, a concave portion is formed in the sealing material 20 by sandblasting or the like. A desiccant is placed in the concave portion. It is preferred to perform the degassing by annealing in vacuum, immediately before the adhesion of the sealing material 20. Moreover, it is preferred to bond the sealing material 20 under an ambient containing an inert gas (a rare gas or nitrogen).

In the case where an electrical resistivity of the adhesive 22 having electrical conductivity is relatively high, the electrode is formed on the sealing material 20 in advance. Then, upon bonding, the electrode is electrically connected to the adhesive 22 having electrical conductivity so as to lower the resistance. In this case, it is preferred to use an inorganic insulating material coated with a low-resistance metal film such as gold, as the spacer 22a. Thus, it is possible to maintain a distance between the sealing material 20 and the second electrode 11 with a particle diameter of the spacer 22a as well as to permit the electrical connection between the second electrode 11 and the electrode on the sealing material 20 and the electrical connection between the connection wiring 17 and the electrode on the sealing material 20. In the case where a plurality of kinds of particles having different diameters are used, an organic material having elasticity is used for a particle having a larger diameter, whereas an inorganic material is used for a particle having a smaller diameter. Upon contact bonding of the sealing material 20, the particle having a larger diameter is deformed so as to achieve the face contact with the electrode on the sealing material 20.

(Embodiment Mode 2)

Figure 2A:
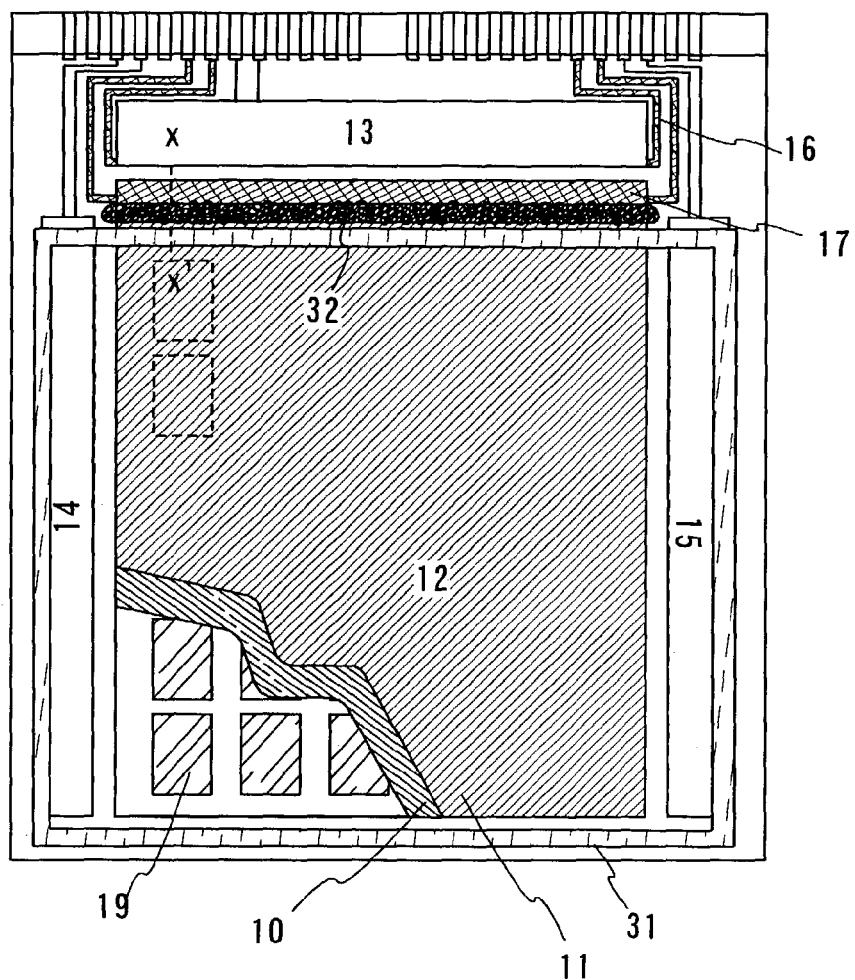
FIGS. 2A and 2B are a top view and a cross-sectional view showing Embodiment Mode 2, respectively.
Figure 2B:
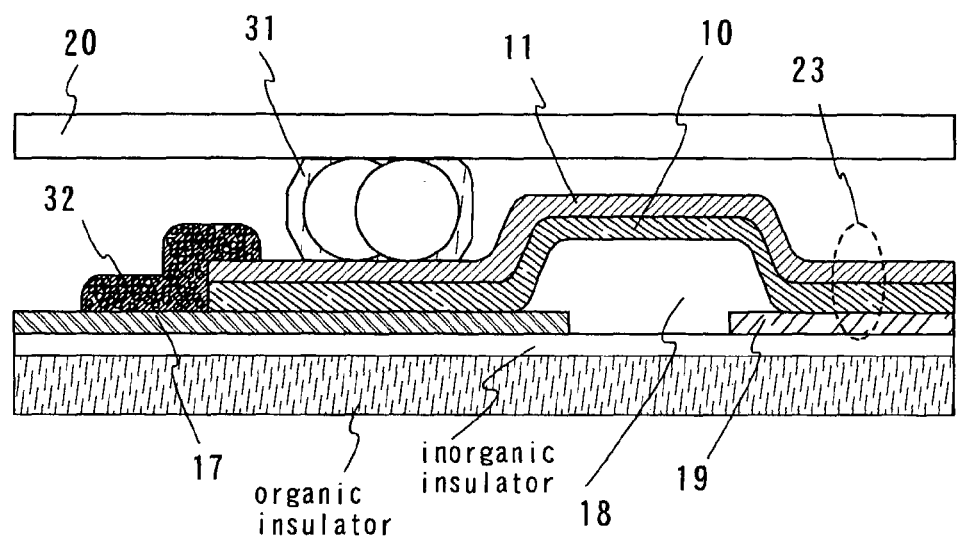

FIGS. 2A and 2B show an example of a structure different from that shown in FIGS. 1A and 1B, where an adhesive having electrical conductivity is formed on a large area. For the purpose of simplification, the same components as those in FIGS. 1A and 1B are denoted by the same reference numerals in FIGS. 2A and 2B. Since the components up to the second electrode 11 in FIGS. 2A and 2B are the same as those in FIGS. 1A and 1B, the detailed description thereof is herein omitted.

In Embodiment Mode 2, an example where a conductive material 32 is partially formed and a sealer 31 is separately formed is shown. The connection wiring 17 and the second electrode 11 are electrically connected to each other through the conductive material 32. Since the layer 10 containing an organic compound is etched in a self-aligned manner using the second electrode 11 as a mask, the end face of the second electrode 11 is flush with that of the layer 10 containing an organic compound. The conductive material 32 is provided so as to be in contact with the end faces.

In FIGS. 2A and 2B, as the conductive material 32, a conductive paste as is represented by a silver paste or a copper paste, a conductive ink, or a nanometal ink (an independently dispersed ultrafine particle dispersion solution, in which Ag, Au or Pd having a particle diameter of 5 to 10 nm is dispersed at a high density without aggregation) is used. For example, a conductive material containing a silver-plated copper powder, a phenol resin, dimethylene glycol monomethyl ether and the like as a main component and having a specific resistance of $5 \times 10^{-4}$ Ω·cm or less and an adhesive strength of 0.8 kg/mm$^2$ or higher may be used as the conductive material 32. Alternatively, a quick-drying silver type conductive agent (a modified polyolefin resin containing a flat-shaped silver powder having a particle diameter of 0.5 to 1 µm) may also be used as the conductive material 32.

In the case where a solvent is used as the conductive material 32, there is concern that a vapor might be generated due to heat, thereby contaminating the layer containing an organic compound. In order to cope with this problem, the sealer 31 is provided between the conductive material 32 and the pixel portion 12 so as to prevent the layer 10 containing an organic compound from being contaminated in the present invention. Therefore, it is preferred to form the conductive material 32 after the sealer 31 is formed to be adhered to the sealing material 20. The order of formation of the sealer 31 and the conductive material 32 is not specially limited. Instead of the above-described order, after formation of the conductive material 32, the sealer 31 may be formed to be adhered to the sealing material 20.

The sealer 31 contains a filler mixed therein. The filler serves to bond the sealing material 20 while keeping an even distance. Moreover, a spacer may be mixed therein in addition to the filler. The sealer 31 may also be formed to partially overlap the gate-side driving circuits 14 and 15 as shown in FIG. 2A.

Light emitted from the light emitting element 23 can be obtained in either direction in the structure shown in FIGS. 2A and 2B. Moreover, it is essential for the sealing material 20 to have translucency in the case where light emitted from the light emitting element 23 is transmitted through the light emitting material so as to be obtained.

Embodiment Mode 2 can be freely combined with Embodiment Mode 1.

(Embodiment Mode 3)

Figure 3A:
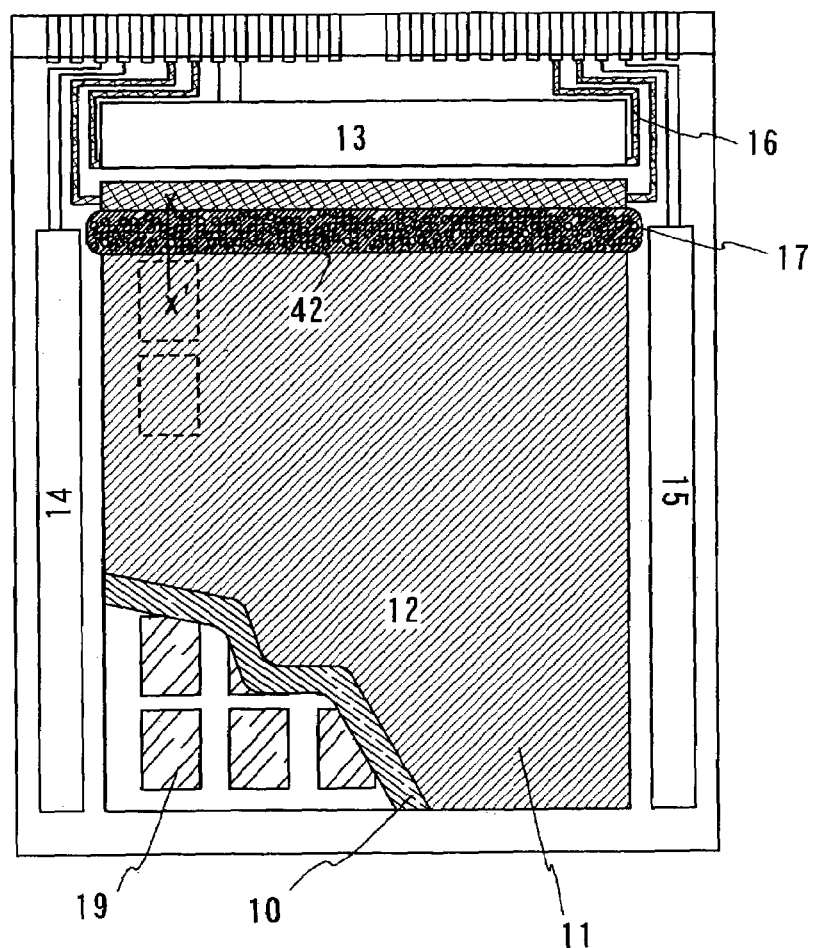
FIGS. 3A and 3B are a top view and a cross-sectional view showing Embodiment Mode 3, respectively.
Figure 3B:
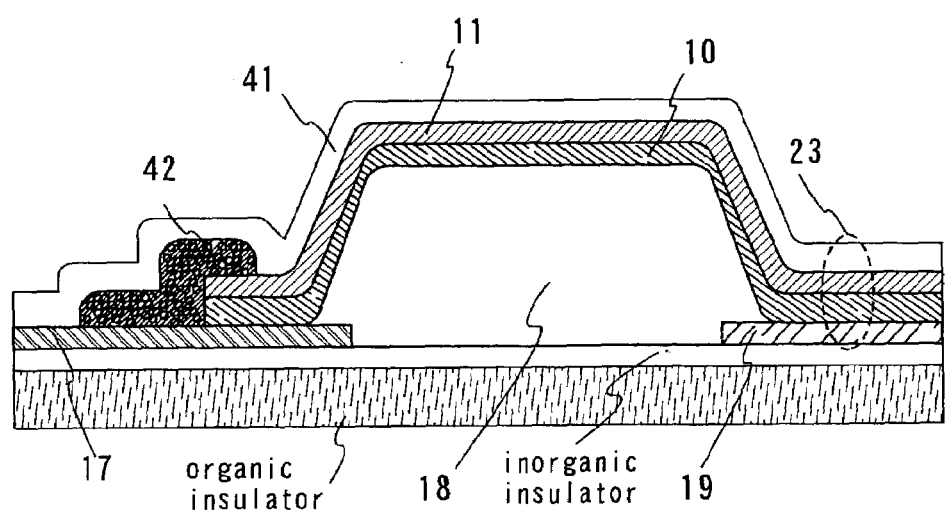

FIGS. 3A and 3B show an example of a structure different from those shown in FIGS. 1A and 1B, and FIGS. 2A and 2B, in which the sealing material is bonded. For the purpose of simplification, the same components as those in FIGS. 1A and 1B are denoted by the same reference numerals in FIGS. 3A and 3B. Since the components up to the second electrode 11 in FIGS. 3A and 3B are the same as those in FIGS. 1A and 1B, the detailed description thereof is herein omitted.

In Embodiment Mode 3, an example where a conductive material 42 is partially formed and sealing is conducted using a protective film 41 is shown. The connection wiring 17 and the second electrode 11 are electrically connected to each other through the conductive material 42. Since the layer 10 containing an organic compound is etched in a self-aligned manner using the second electrode 11 as a mask, the end face of the second electrode 11 is flush with that of the layer 10 containing an organic compound. The conductive material 42 is provided so as to be in contact with the end faces.

Similarly to the conductive material 32 described in the above-described Embodiment Mode 2, a conductive paste as is represented by a silver paste or a copper paste, or a conductive ink is used as a conductive material 42 shown in FIGS. 3A and 3B. Alternatively, a nanometal ink (an independently dispersed ultrafine particle dispersion solution in which Ag, Au or Pd having a particle diameter of 5 to 10 nm is dispersed at a high density without aggregation) may also be used as the conductive material 42. The nanometal ink is baked at 220 to 250° C.

After formation of the conductive material 42, a protective film 41 is formed. As the protective film 41, an insulating film containing silicon nitride or silicon oxynitride as a main component obtained by sputtering (a DC method or an RF method) or a thin film containing carbon as a main component obtained by a PCVD method is used. A silicon nitride film can be obtained when the film formation is conducted in an ambient containing nitrogen and argon, using a silicon target. Alternatively, a silicon nitride target may be used instead. The protective film 41 may also be formed by using a film formation apparatus using a remote plasma. In the case where emitted light is to be transmitted through the protective film, it is preferred that a thickness of the protective film is as thin as possible.

In the present invention, the thin film containing carbon as a main component is characterized by being a DLC (Diamond Like Carbon) film having a thickness of 3 to 50 nm. The DLC film has a $SP^3$ bond as a bond between carbon atoms in terms of short-distance order as well as an amorphous structure at the macroscopic level. As a composition of the DLC film, the DLC film contains carbon at 70 to 95 atm % and hydrogen at 5 to 30 atm %. The DLC film is extremely hard and excellent in insulation properties. Moreover, such a DLC film is characterized by its low gas permeability to a vapor, oxygen or the like. Moreover, it is known that this film has a hardness of 15 to 25 GPa on the basis of measurement by a microhardness tester.

The DLC film can be formed by a plasma CVD method (typically, an RF plasma CVD method, a microwave CVD method, an electron cyclotron resonance (ECR) CVD method and the like), sputtering or the like. With any of the film formation methods, the DCL film can be formed with good adherence. The DLC film is formed while the substrate is being placed on a cathode. Alternatively, a negative bias is applied so that a fine and hard film can be formed by utilizing ion impact to a certain degree.

As a reactive gas used for film formation, a hydrogen gas and a hydrocarbon type gas (for example, $CH_4$, $C_2H_2$, $C_6H_6$ or the like) is used. The reactive gas is then ionized by glow discharge. The obtained ions are accelerated to collide against a negatively self-biased cathode so as to form the DLC film. As a result, a fine and smooth DLC film can be obtained. The obtained DLC film is an insulating film which is transparent or semitransparent to visible light. Throughout this specification, the sentence "transparent to visible light" means that a transmittance of visible light is 80 to 100%, and the sentence "semitransparent to visible light" means that a transmittance of visible light is 50 to 80%.

In the case where a silicon nitride film is formed by sputtering so as to be in contact with a film formed of a transparent conductive film, there is a possibility that an impurity (In, Sn, Zn or the like) contained in the transparent conductive film may enter the silicon nitride film so as to be mixed therein. In this case, it is possible to prevent the impurity from entering the silicon nitride film by forming a silicon oxide film serving as a buffer layer between the transparent conductive film and the silicon nitride film. The formation of the buffer layer having the above structure prevents the impurity from entering the transparent conductive film so that an excellent protective film containing no impurity can be formed.

Moreover, after formation of the protective film, a sealer may be formed so as to be bonded to the sealing material for enhanced sealability.

Embodiment Mode 3 can be freely combined with any one of Embodiment Modes 1 and 2.

(Embodiment Mode 4)

Figure 4A:
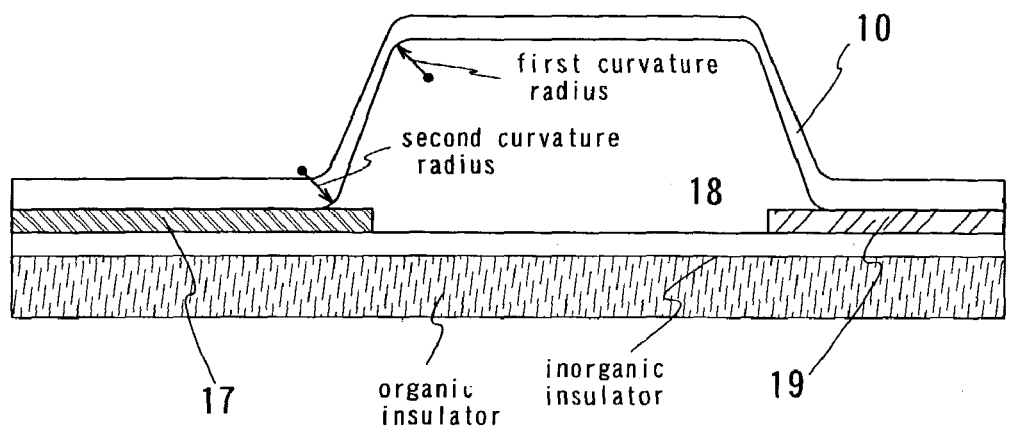
FIGS. 4A to 4C are cross-sectional views showing etching steps of Embodiment Mode 4.

Herein, a forming process of a light emitting element is simply explained below with reference to FIGS. 4A, 4B, and 4C. For the purpose of simplification, the same components as those in FIGS. 1A and 1B are denoted by the same reference numerals in FIGS. 4A, 4B, and 4C.

First, after forming a TFT (not shown herein), the first electrode 19, the connection wiring 17 and the insulator 18 on a substrate, a layer 10 containing an organic compound is formed by application utilizing spin coating. Thereafter, the layer 10 containing the organic film is baked by heating under vacuum (FIG. 4A). In the case of the layer 10 containing an organic compound is formed to have a laminate structure, the film formation and the baking may be repeated.

Figure 4B:
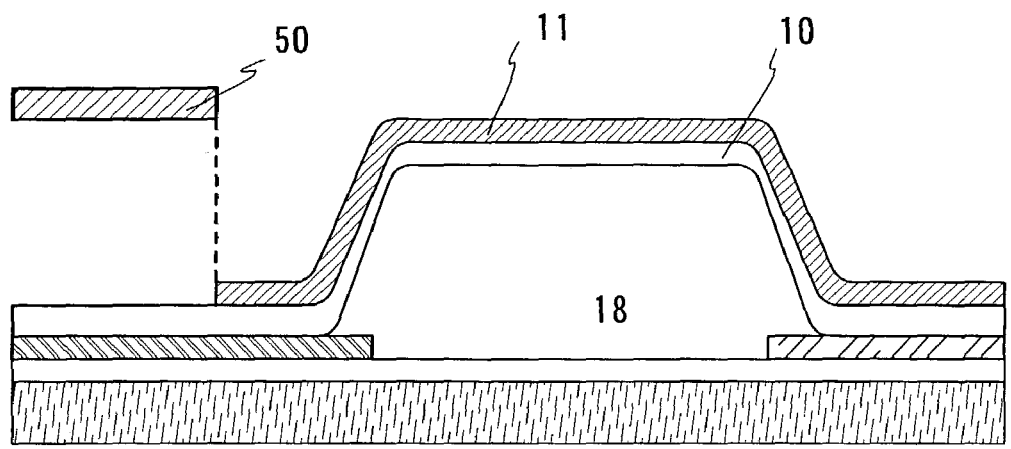

Next, the second electrode 11 made of a metal is selectively formed by vapor deposition using a vapor deposition mask 50 (FIG. 4B). Although FIG. 4B shows an example where the vapor deposition is performed with a distance between the metal mask and the layer 10 containing an organic compound, the vapor deposition may be performed while the metal mask and the layer containing the organic compound are being in contact with each other.

Next, the layer 10 containing an organic compound is etched in a self-aligned manner using the second electrode 11 as a mask. In this case, selective etching is performed using a plasma generated by exciting one or a plurality of kinds of gases selected from the group consisting of Ar, H, F and O (FIG. 4C). Herein, it is important to appropriately select a material or a thickness of the second electrode 11 so that the second electrode 11 is resistant to a plasma. The present invention allows the selective formation of the polymeric material layer so as to easily form a structure, in which the layer containing an organic compound is not formed at a junction of the wiring to be connected to an external power source.

Figure 4C:
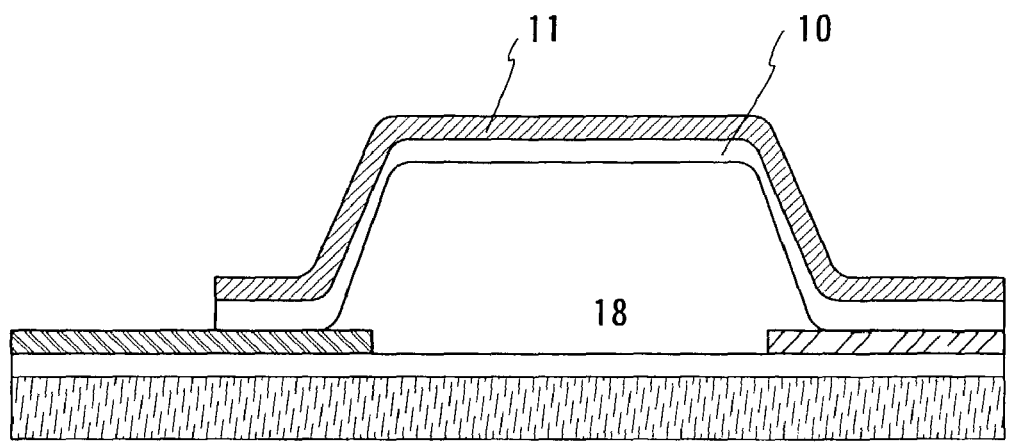

A state shown in FIG. 4C is obtained by the steps so far. In this state, however, the second electrode is not connected to any point, and therefore is in a floating state. Thus, in the later step, the second electrode 11 is electrically connected to the connection wiring 17. As a method for electrically connecting the second electrode 11 to the connection wiring 17, the adhesive 22 having electrical conductivity shown in the above Embodiment Model may be used. Alternatively, the conductive materials 32 and 42 respectively described in Embodiment Modes 2 and 3 above may be used.

Figure 5A:
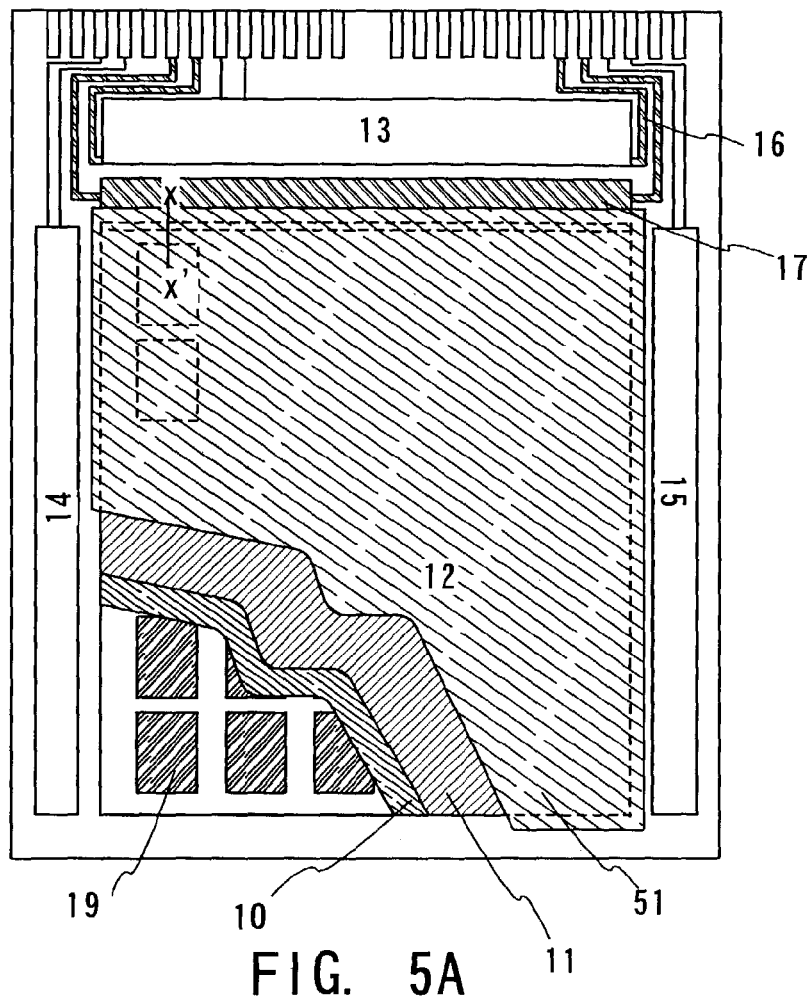
FIGS. 5A and 5B are a top view and a cross-sectional view showing Embodiment Mode 4, respectively.
Figure 5B:
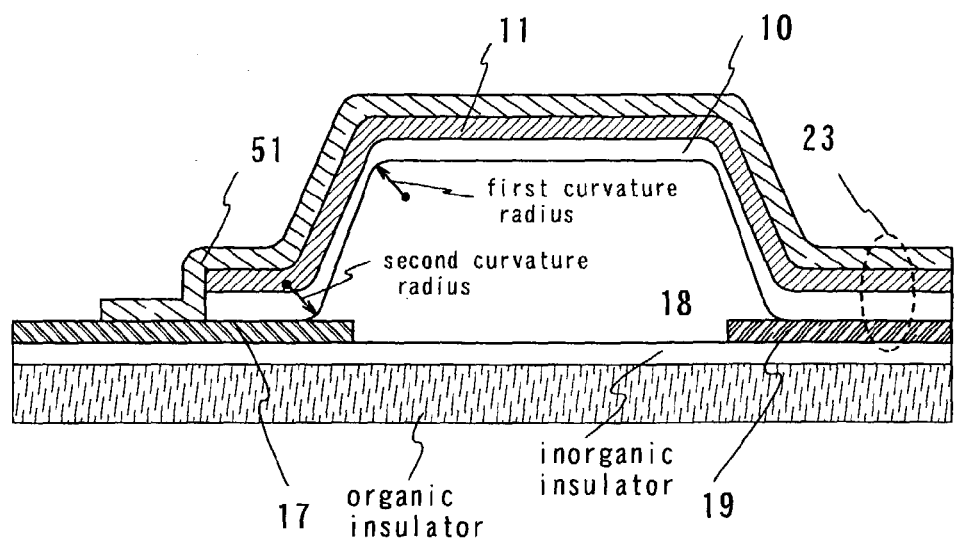

In Embodiment Mode 4, a third electrode 51 made of a low-resistant metal is formed as a method for electrically connecting the second electrode 11 to the connection wiring 17 (FIG. 5B). A top view of a structure fabricated by the steps so far is shown in FIG. 5A.

The third electrode 51 may be appropriately formed by sputtering, vapor deposition or PCVD. Moreover, it is preferred to use a metal having a lower electrical resistivity than that of a material of the second electrode 11, for the third electrode 51. As the third electrode 51, for example, a film containing, as a main component, an element selected from the group consisting of: poly-Si, W, $WSi_x$, Al, Ti, Mo, Cu, Ta, Cr and Mo, which is doped with an impurity element for imparting an electrical conductivity type, a film made of an alloy material or a compound material containing the above-described element as a main component, or a laminate film thereof is used. In this case, an electrode made of a laminate layer (specifically, a laminate of TiN, Al and TiN) including a nitride layer or a fluoride layer as the uppermost layer is used as the third electrode 51. Therefore, light emitted from the light emitting element can be transmitted through the first electrode 19 so as to be obtained.

Moreover, the same material as that of the second electrode 11 may be used for the third electrode 51. In such a case, it is preferable that a thickness of the third electrode 51 is set larger than that of the second electrode 11 so as to reduce the resistance. Furthermore, in the case where the same material as that of the second electrode 11 is used for the third electrode 51, a thickness of the second electrode 11 can be further reduced.

As the step after formation of the third electrode 51, the light emitting element may be sealed by forming a protective film or adhering a sealing material thereto.

Figure 17:
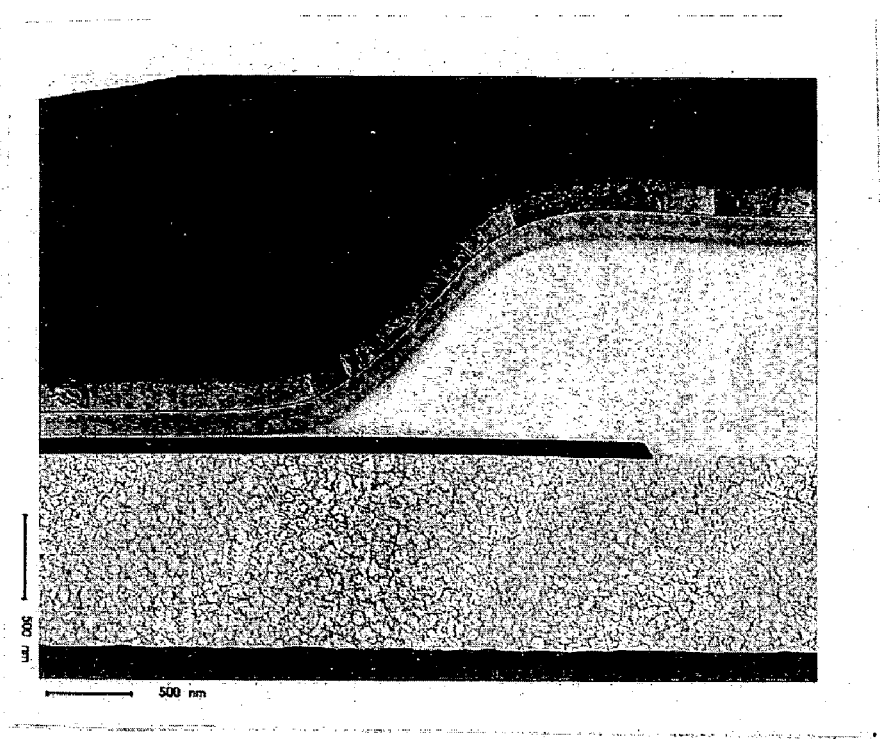
FIG. 17 is a photographic view showing a cross section of the periphery of an insulator of Embodiment Mode 4.
Figure 18:
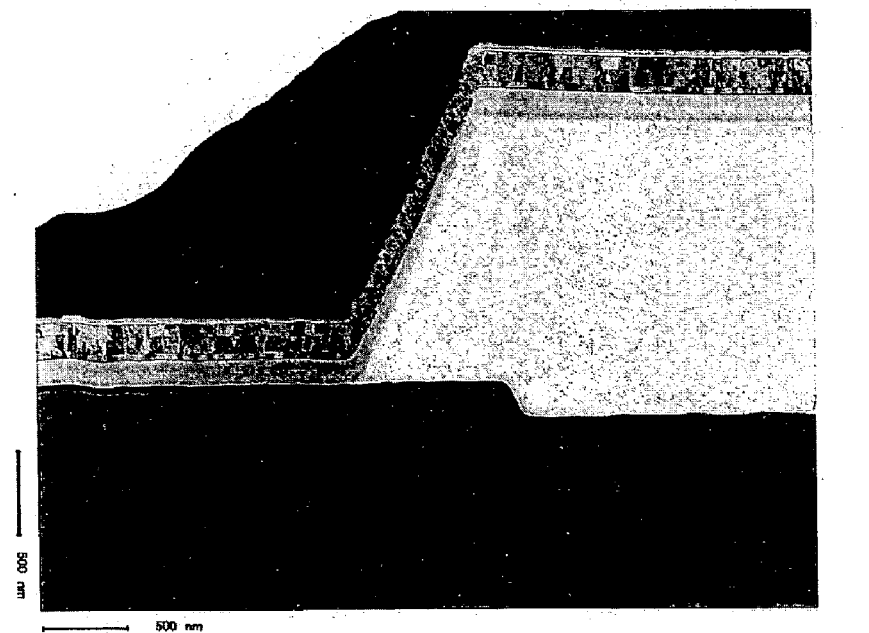
FIG. 18 is a photographic view showing a cross section of the periphery of an insulator of a comparative example.

Hereinafter, a cross-sectional shape of the insulator 18 made of an organic material shown in FIG. 5B will be described because it is important. In the case where an organic compound film is to be formed on the insulator 18 by application or a metal film serving as a cathode is to be formed by vapor deposition, if a lower end or an upper end of the insulator 18 does not have a curved surface, poor film formation occurs as shown in FIG. 18 where a convex portion is formed on the upper end of the insulator 18. Therefore, in the present invention, the upper end of the insulator 18 has a curved surface having a first curvature radius, whereas the lower end of the insulator 18 has a curved surface having a second curvature radius, as shown in FIGS. 17 and 5B. It is preferred that both the first and second curvature radii are 0.2 to 3 μm. With the present invention, good coverage for the organic compound film or the metal film can be obtained. Moreover, a defect called shrink, i.e., reduction of a light emitting area, can be decreased. Furthermore, the shrink can be reduced by forming a silicon nitride film or a silicon oxynitride film on the insulator 18. A taper angle on the side face of the insulator 18 may be set at 45°±10°.

As the insulator 18, an inorganic material (silicon oxide, silicon nitride, silicon oxynitride or the like), a photosensitive or non-photosensitive organic material (polyimide, acrylic, polyamide, polyimide amide, a resist or benzocyclobutene), or a laminate thereof can be used. In the case where the insulator 18 is desired to include a curved surface having a first curvature radius at its upper end and a curved surface having a second curvature radius at its lower end as shown in FIGS. 17 and 5B, the formation is facilitated by the use of a photosensitive organic material. Moreover, either a photosensitive negative type material, which is rendered insoluble to an etchant by light, or a photosensitive positive type material, which is rendered soluble to an etchant by light, may be used as the insulator 18.

Figure 21A:
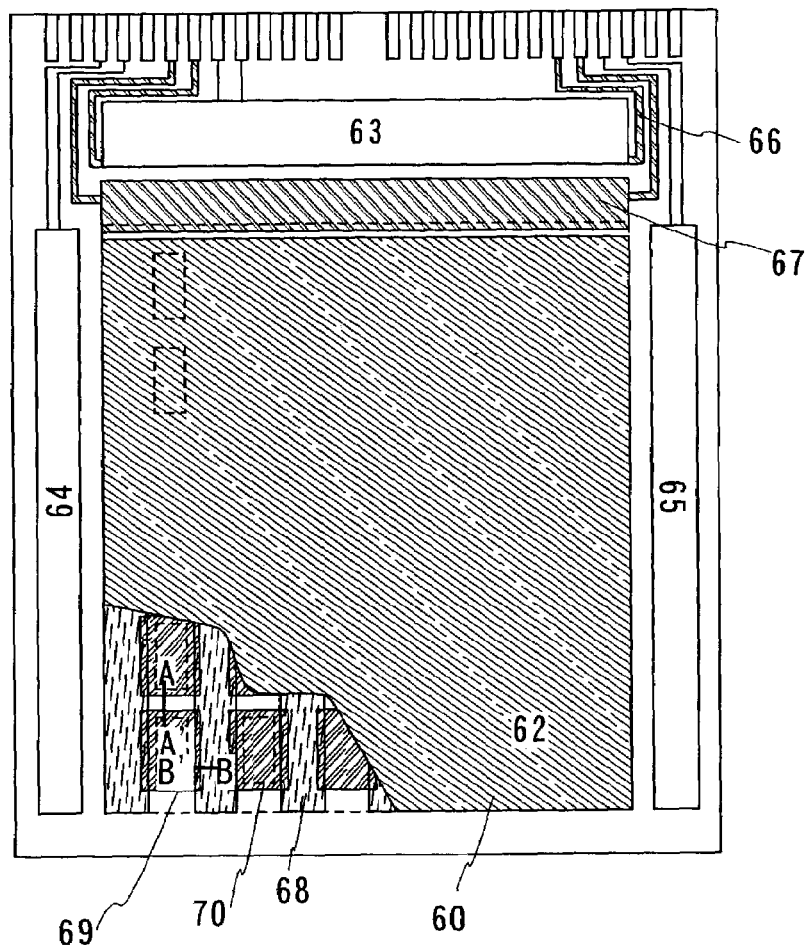
FIGS. 21A to 21C are a top view and cross-sectional views showing Embodiment Mode 4.
Figure 21B:
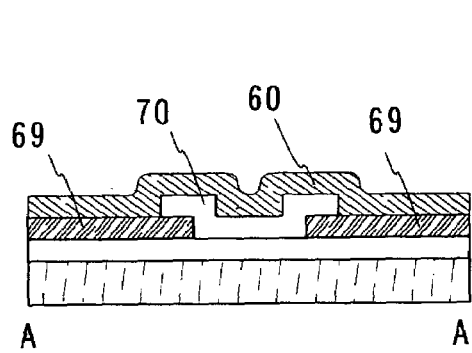
Figure 21C:
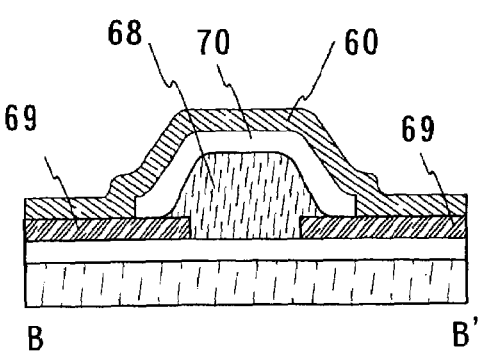

FIGS. 21A and 21C show an example where a protective film 70 made of a silicon nitride film is formed on an insulator 68 and a pattern of the insulator is different from that of the silicon nitride film. For simplification, FIG. 21A shows a top view at the stage where the components up to a layer 60 containing an organic component are formed; FIG. 21B shows a cross-sectional view cut along a line A–A' in FIG. 21A; and FIG. 21C shows a cross-sectional view cut along a line B–B' in FIG. 21A. In the cross-sectional view shown in FIG. 21B, the insulator 68 is not present between adjacent first electrodes 69. In FIG. 21A, the insulator 68 has a stripe-shaped pattern. The silicon nitride film serving as the protective film 70 has a grid pattern as is indicated with a dotted line, which covers only ends of each of the first electrodes 69. With the insulator 68 having a stripe-shaped pattern, it is possible to more easily remove a particle or an impurity in wet cleaning of a surface of the first electrode 69, than with the insulator having a grid pattern. In FIGS. 21A to 21C, a part of a pixel portion 62, which is not covered with the protective film 70, functions as a light emitting region.

Instead of using the silicon nitride film, a silicon oxynitride film or a film represented by $AlN_xO_y$ may be used as the protective film 70. The film represented by $AlN_xO_y$ may be formed while introducing oxygen, nitrogen or a rare gas from a gas introduction system, by sputtering using a target made of AlN or Al. It is sufficient for the layer represented by $AlN_xO_y$ to contain nitrogen at several atm % or higher, preferably, 2.5 atm % to 47.5 atm %, and oxygen at 47.5 atm % or lower, preferably, 0.01 to less than 20 atm %.

By forming the protective film 70 on the insulator 68, it is possible to improve the evenness in film thickness of the layer 60 containing an organic compound. Therefore, heat generation due to electric field concentration caused upon light emission can be restrained. As a result, the degradation of the light emitting element as is represented by shrink, i.e., reduction in light emitting area, can be prevented.

Embodiment Mode 4 can be freely combined with any one of Embodiment Modes 1 to 3.

The present invention having the above-described structure will be described in further detail by embodiments described below.

(Embodiments)

[Embodiment 1]

In this embodiment, a structure, in which light emitted from an EL element is transmitted through an element substrate so as to be reflected onto viewer's eyes, will be described below. In this case, a viewer can recognize an image from the element substrate side.

Figure 6A:
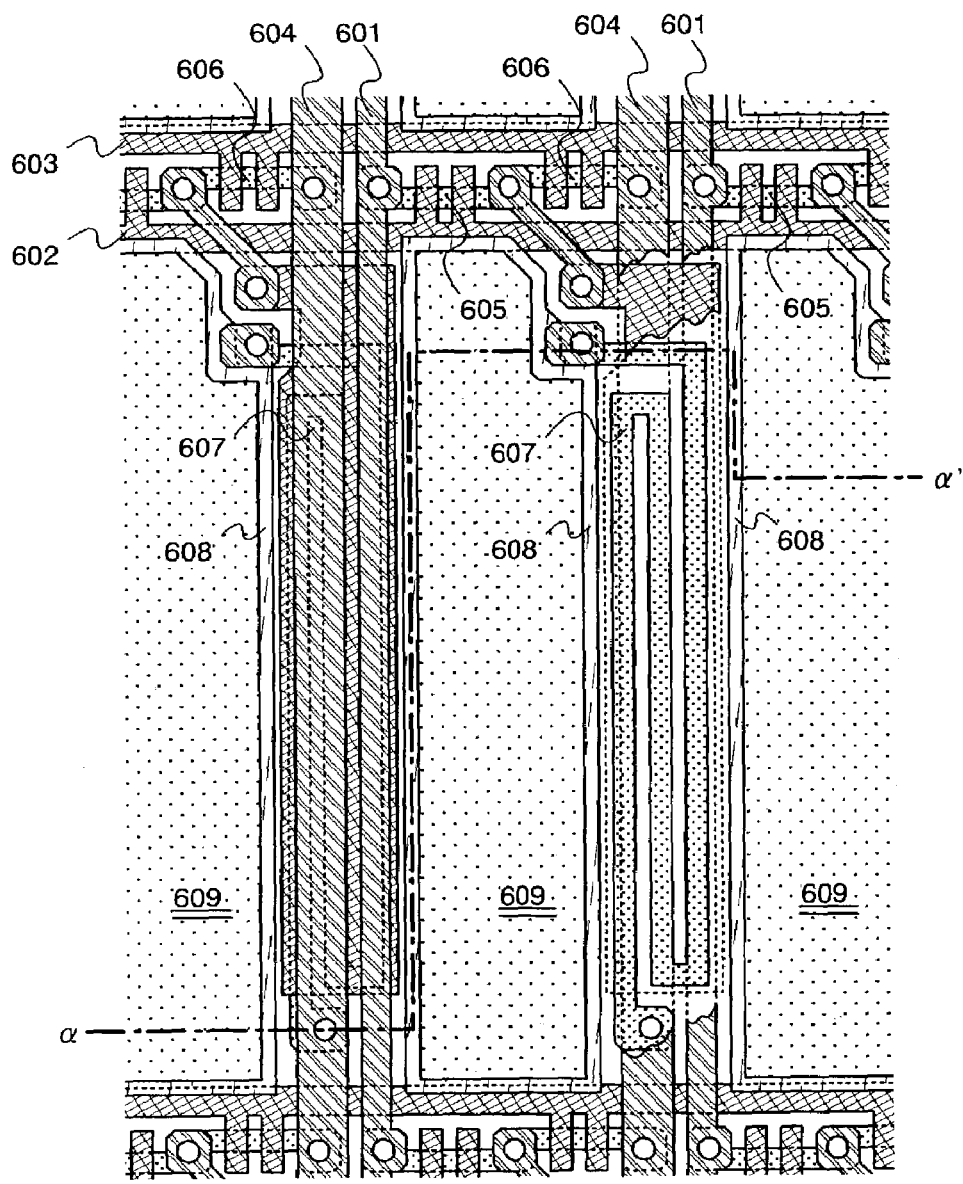
FIGS. 6A and 6B are a top view and a cross-sectional view showing a pixel of Embodiment 1, respectively.

First, a pixel structure, in which three TFTs are placed for one pixel, will be described. FIG. 6A shows an example of a top view showing a pixel in detail.

The structure shown in FIG. 6A includes a TFT 606 for erasing in the case where SES driving is to be performed. A gate electrode of the TFT 606 and a second gate signal line 603 for inputting a signal for erasing are connected to each other. A source electrode and a power supply line 604 are connected to each other. A drain electrode is connected to a drain electrode of a TFT 605 for switching and a gate electrode of a TFT 607 for driving.

In the case of three-transistor type, two TFTs, that is, the TFT 605 for switching and the TFT 606 for erasing are horizontally placed in a linear manner between the first gate signal line 602 and the second gate signal line 603. A drain region of the TFT 605 for switching and a drain region of the TFT 606 for erasing may overlap each other. At this time, a point where a source region of the TFT 605 for switching is present, a point where a drain region thereof is present, a point where a source region of the TFT 606 for erasing is present, and a point where a drain region thereof is present are placed so as to be arranged on a single straight line.

With the arrangement as described above, an aperture ratio can be increased so as to provide an opening in a simple shape.

Figure 6B:
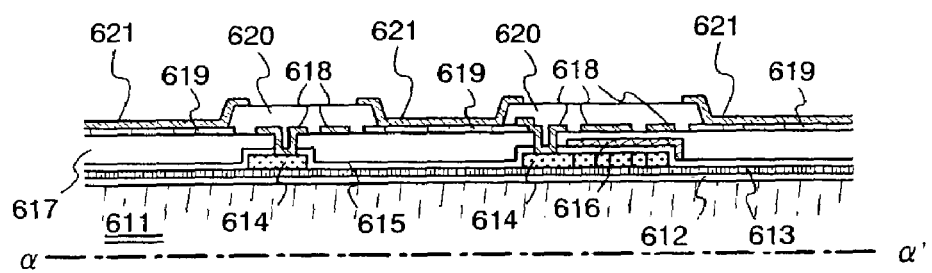

FIG. 6B shows a cross section cut along a line á–á' in FIG. 6A. A semiconductor layer 614 may be longitudinally meandered as is the TFT 607 for driving. With such a shape of the semiconductor layer 614, it is possible to increase a channel length L of the TFT 607 for driving without decreasing an aperture ratio. In order to lower an OFF current value, the TFT 607 for driving may be a TFT having a plurality of channels. It is preferred that the channel length L of the TFT 607 for driving is 100 μm or more. In the case where the channel length L is increased, an oxide film capacitance $C_{OX}$ is correspondingly increased. Therefore, it is possible to use a part of the capacitance as a storage capacitor for an organic light emitting element. Conventionally, in order to form a storage capacitor for each pixel, a space for forming the storage capacitor is additionally required, Furthermore, a capacitor line, a capacitor electrode and the like are provided. With the pixel structure of the present invention, however, the formation of the capacitor line or the capacitor electrode can be omitted. Moreover, in the case where a storage capacitor is formed by using the oxide film capacitance $C_{OX}$, the storage capacitor is formed by a gate electrode using a gate insulating film as a dielectric and a semiconductor (channel formation region) overlapping the gate electrode through the gate insulating film. Therefore, even if the channel length of the TFT is increased, the pixel can be designed without decreasing the aperture ratio as long as the semiconductor layer of the TFT 607 for driving, which is connected to a pixel electrode 608, is placed under the power supply line 604 or the source signal line 601 placed as an upper layer on the gate electrode. More specifically, with the pixel structure as shown in FIGS. 6A and 6B, a sufficient storage capacitor can be provided even if a space for forming the capacitor electrode or the capacitor wiring is omitted, thereby further increasing the aperture ratio. Furthermore, in the case where the channel length L is increased, variation in electrical properties among TFTs can be reduced even if a variation occurs in a TFT manufacturing process such as in an irradiation condition of laser light.

FIGS. 8A and 8B show an exterior appearance of an active-matrix light emitting device. FIG. 8A is a top view showing an active-matrix light emitting device, and FIG. 8B is a cross-sectional view cut along a line A–A' in FIG. 8A.

The active-matrix light emitting device includes a source-side driving circuit 901, a pixel portion 902, and a gate-side driving circuit 903, each being indicated with a dotted line. The reference numeral 904 indicates a sealing substrate, and the reference numeral 905 indicates a sealing agent. The interior surrounded by the sealing agent 905 forms a space 907.

A wiring 908 serves to transmit a signal to be input to the source-side driving circuit 901 and the gate-side driving circuit 903, and receives a video signal or a clock signal from a flexible print circuit (FPC ; terminal portion) 909 serving as an external input terminal. Although the FPC (terminal portion) alone is shown, a printed wiring board (PWB) may be attached to the FPC (terminal portion). The light emitting device in this specification includes not only a main body of the light emitting device but also the FPC (terminal portion) or the PWB attached thereto.

Next, a cross-sectional structure will be described with reference to FIG. 8B. Although driving circuits and a pixel portion are formed on the substrate 910, the source-side driving circuit 901 as a driving circuit and the pixel portion 902 are shown.

As the source-side driving circuit 901, a CMOS circuit, in which an n-channel TFT 923 and a p-channel TFT 924 are combined with each other, is formed. Each of TFTs forming the driving circuit may be formed by a known CMOS circuit, PMOS circuit or NMOS circuit. Although a driver-integrated type light emitting device, in which a driving circuit is formed on a substrate, is shown in this embodiment, this structure is not necessarily required. Alternatively, a driving circuit may be formed in the exterior, not on the substrate.

The pixel portion 902 is formed by a plurality of pixels, each including the TFT 911 for switching, a TFT 912 for current control, and a first electrode (anode) 913 electrically connected to a drain of the TFT 912 for current control.

Insulators 914 are formed on both ends of the first electrode (anode) 913. On the first electrode (anode) 913, a layer 915 containing an organic compound is formed. On the layer 915 containing an organic compound, a second electrode (cathode) 916 having the same pattern shape as that of the layer 915 containing an organic compound and having an end being flush with that of the layer 915 is formed. As a result, a light emitting element 918 composed of the first electrode (anode) 913, the layer 915 containing an organic compound, and the second electrode (cathode) 916 is formed. Since the light emitting element 918 emits white light in this example, a color filter (not shown for simplification) composed of a colored layer and BM is provided on the substrate 910.

For electrical connection between the second electrode 916 and the wiring 908, a third electrode 917 shown in Embodiment Mode 4 is formed in this embodiment. The third electrode 917, which is in contact with the second electrode 916 and the wiring 908, functions as a common wiring for all pixels. The third electrode 917 is electrically connected to the FPC (terminal portion) 909 via the wiring 908.

In order to seal the light emitting element 918 formed on the substrate 910, a sealing substrate 904 is attached to a sealing agent 905. In order to hold a distance between the sealing substrate 904 and the light emitting element 918, a spacer made of a resin film may also be provided. The space 907 inside the sealing agent 905 is filled with an inert gas such as nitrogen. It is preferred to use an epoxy type resin as the sealing agent 905. Moreover, it is desirable that the sealing agent 905 does not allow moisture or oxygen to be permeated therethrough as much as possible. Furthermore, the interior of the space 907 may contain a substance having the effect of absorbing oxygen or water.

In addition to a glass substrate or a quartz substrate, a plastic substrate made of FRP (Fiberglass-Reinforced Plastics), PVF (polyvinyl fluoride), Mylar, polyester, acrylic or the like can also be used as a material constituting the sealing substrate 904 in this embodiment. Moreover, after bonding the sealing substrate 904 by using the sealing agent 905, it is possible to seal with a sealing agent so as to cover its side face (exposed face).

By sealing the light emitting element within the space 907 in a manner as described above, the light emitting element can be completely blocked from the exterior. Therefore, a substrate accelerating the degradation of the layer containing an organic component such as moisture or oxygen can be prevented from entering from the exterior. Accordingly, a highly reliable light emitting device can be obtained.

An example of a manufacturing process of the above-described structure is shown in FIGS. 7A to 7C.

FIG. 7A is a cross-sectional view at the stage where a second electrode (a cathode made of Li—Al) is selectively formed by using a vapor deposition mask after formation of an organic compound film (a laminate layer containing PEDOT) by application. For simplification, a method for manufacturing an anode made of a transparent conductive film or a TFT is herein omitted.

Next, FIG. 7B is a cross-sectional view at the stage where the organic compound film (the laminate layer containing PEDOT) is etched in a self-aligned manner by a plasma using the second electrode as a mask.

Next, FIG. 7C is a cross-sectional view at the stage where a third electrode to be connected to a connection wiring is selectively formed. The second electrode and the third electrode may be formed of the same material, or a material of the third electrode may have a lower electrical resistivity than that of the second electrode.

This embodiment shows an example of a method with a combination of a white-light emitting element and a color filter (hereinafter, this method is referred to as a color filter method). Hereinafter, a method for forming a white-light emitting element so as to obtain full-color display will be described with reference to FIG. 10A.

According to a color filter method, a light emitting element including an organic compound film emitting white light is formed, so that the emitted white light is transmitted through a color filter so as to obtain emission of red, green and blue light.

Although there are various methods for obtaining the emission of white light, the case of using a light emitting layer made of a polymeric material, which can be formed by application, will be described herein. In this case, dye doping to a polymeric material serving as a light emitting layer can be performed by adjusting a solution. The emission of white light can be extremely easily obtained as compared with a vapor deposition method of performing co-deposition for doping a plurality of dyes.

Specifically, after forming of a film containing poly (ethylene dioxythiophene) (PEDOT) by application and baking of a poly(ethylene dioxythiophene)/poly(styrene sulfonic acid) solution (PEDOT/PSS) acting as a hole injection layer on the entire surface of an anode made of a metal having a large work function (Pt, Cr, W, Ni, Zn, Sn, In), a luminescence center dye (1,1,4,4-tetraphenyl-1,3-butadiene (TPB), 4-dicyanomethylene-2-methyl-6(p-dimethylamino-styryl)-4H-pyran (DCM1), Nile Red, coumarin 6 or the like) acting as a light emitting layer doped with polyvinyl carbazole (PVK) is applied on the entire surface and then is baked. Thereafter, a cathode made of a laminate layer composed of: a thin film containing a metal having a small work function (Li, Mg or Cs); and a transparent conductive film (ITO (an alloy of indium oxide and tin oxide), an alloy of indium oxide and zinc oxide ($In_2O_3$—ZnO), zinc oxide (ZnO) and the like) deposited thereon is formed. PEDOT/PSS uses water as a solvent and is not soluble to an organic solvent. Therefore, even if PVK is to be applied thereon, there is no possibility that PEDOT/PSS might be dissolved again therein. Moreover, since PEDOT/PSS and PVK use respectively different solvents, it is preferred not to use the same film formation chamber.

Although the example where the layer containing an organic compound is constituted as a laminate layer is described as illustrated in FIG. 9B, the layer containing an organic compound may be constituted as a single layer as shown in FIG. 9A. For example, 1, 3, 4-oxadiazole derivative (PBD) having electron transportability may be dispersed in polyvinyl carbazole (PVK) having hole transportability. Moreover, PBD is dispersed at 30 wt % as an electron transport agent, and an appropriate amount of four kinds of dyes (TPB, coumarin 6, DCM1 and Nile Red) is dispersed, thereby obtaining the emission of white light.

The organic compound film is formed between the anode and the cathode. In this structure, holes injected from the anode and electrons injected from the cathode are rebonded to each other in the organic compound film, whereby white light emission can be obtained in the organic compound film.

Alternatively, it is possible to appropriately select an organic compound film emitting red light, an organic compound film emitting green light or an organic compound film emitting blue light so as to combine them for mixing the colors; in this manner, when viewed as a whole, the emission of white light can be obtained.

The organic compound film formed in the above-described manner allows the emission of white light to be obtained when viewed as a whole.

By forming a color filter including a colored layer (R) for absorbing light other than red light, a colored layer (G) for absorbing light other than green light, and a colored layer (B) for absorbing light other than blue light in a direction in which the organic compound film emits white light, the white light emitted from the light emitting element can be separated into red light, green light and blue light. In the case of an active-matrix light emitting device, TFTs are formed between the substrate and the color filter.

For the colored layers (R, G, B), in addition to the simplest striped pattern, an oblique tessellated arrangement, a triangular tessellated arrangement, an RGBG quadruple-pixel arrangement, or an RGBW quadruple-pixel arrangement can be used.

Figure 15:
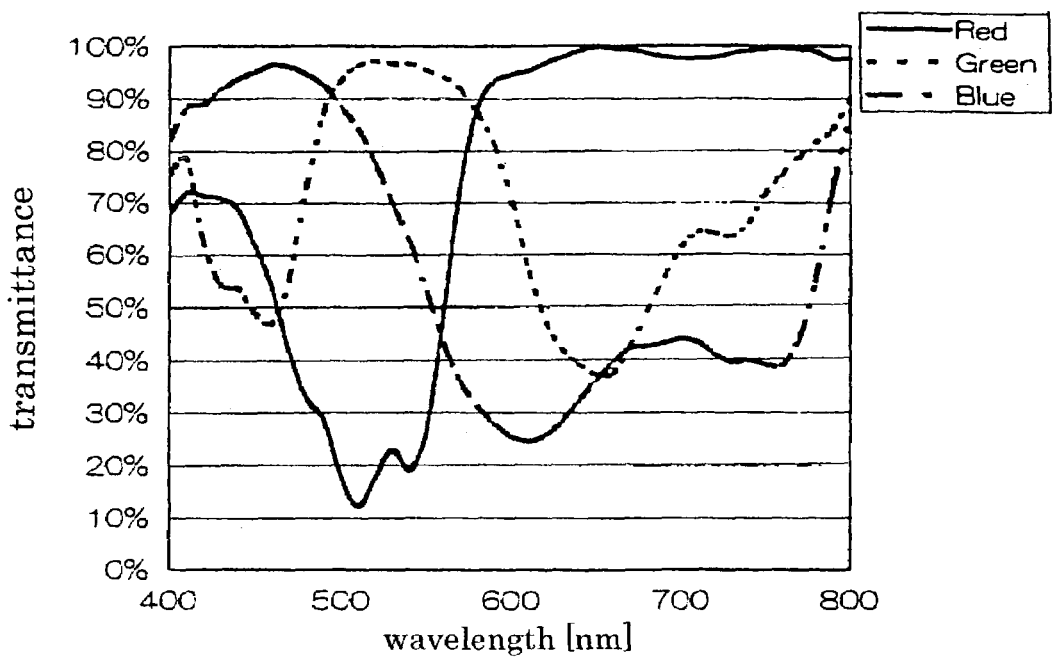
FIG. 15 is a graph showing a transmittance of each of colored layers in Embodiment 1.
Figure 16:
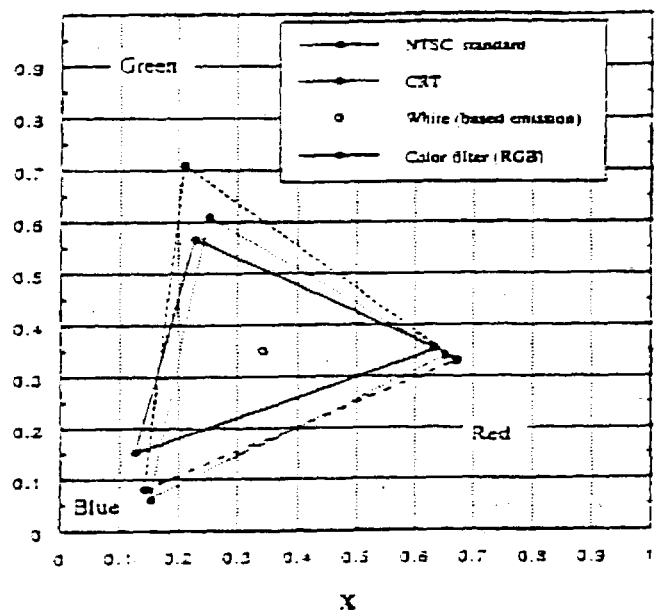
FIG. 16 is a graph showing a chromaticity coordinate of Embodiment 1.

FIG. 15 shows an example of a relation between a transmittance of each colored layer and a wavelength by using a white light source (D65). Each of the colored layers constituting the color filter is formed by a color resist made of an organic photosensitive material in which a pigment is dispersed. FIG. 16 shows a color reproducibility range as a chromaticity coordinate in the case where white light emission and the color filter are combined. A chromaticity coordinate of white light emission is represented by (x, y)=(0.34, 0.35). It is understood from FIG. 16 that the color reproducibility as full color display can be sufficiently ensured.

Since all the organic compound films are constituted to emit white light even if the thus obtained colors of light are different in this case, it is not necessary to separately color the organic compound films for the respective colors of light. Moreover, a circular polarizing plate for preventing the mirror reflection is not particularly required.

Next, a CCM (color changing medium) method, which is realized by combining a blue-light emitting element having an organic compound film for emitting blue light with a fluorescent color conversion layer, will be described with reference to FIG. 10B.

According to the CCM method, fluorescent color conversion layers are excited by blue light emitted from a blue-light emitting element so as to convert the color by each of the color conversion layers. Specifically, the emission of red light, green light and blue light is obtained by converting blue light into red light (B→R) in one color conversion layer, converting blue light into green light (B→G) in one color conversion layer, and converting blue light into blue light (B→B) in one color conversion layer, respectively (the conversion of blue light into blue light can be omitted). Also in the case of the CCM method, TFTs are formed between the substrate and the color conversion layer in the active-matrix light emitting device.

Also in this case, it is not necessary to form separately colored organic compound films. Moreover, a circular polarizing plate for preventing the mirror reflection is not particularly required.

In the case where the CCM method is employed, since the color conversion layers are fluorescent, the color conversion layers are excited by external light to disadvantageously lower the contrast. Thus, as shown in FIG. 10C, it is suitable to enhance the contrast by attaching a color filter or the like thereon. Note that, FIG. 10C shows an example in which a white color-light emitting device is used, however, monochromatic light emitting device can be used.

Alternatively, as shown in FIG. 9C, the emission of white light can be obtained by laminating a layer made of a polymeric material and a layer made of a monomeric material as the layer containing an organic compound. In the case the emission of white light is to be obtained by a laminate layer, after forming a layer made of a polymeric material serving as a hole injection layer by application, co-deposition may be performed by vapor deposition so as to dope a dye, which emits light of a different color from that of a light emitting region, into a hole transport layer, thereby mixing the color of the dye with the color of light emitted from the light emitting region. By appropriately adjusting a material of the light emitting layer or the hole transport layer, the emission of white light can be obtained when viewed as a whole.

Moreover, according to the present invention, the layer containing an organic compound made of a polymeric material is etched in a self-aligned manner by a plasma using an electrode as a mask. The present invention is applicable not only to a white-light emitting element but also to a colored-light emitting element including at least one layer made of a polymeric material as the layer containing an organic compound.

FIGS. 11A to 11D show an example of a laminate structure of a light emitting element.

Figure 11A:
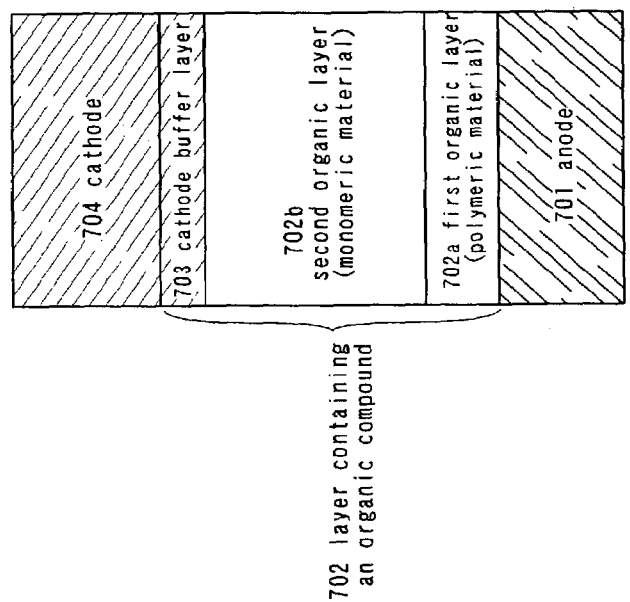
FIGS. 11A to 11D are schematic views in the case where full-color display is achieved by using a laminate layer composed of a polymeric material and a monomeric material in Embodiment 1.

A laminate structure shown in FIG. 11A includes, on an anode 701, an layer 702 containing an organic compound composed of a first organic layer 702a made of a polymeric material, a second organic layer 702b made of a monomeric material, and a cathode buffer layer 703. By appropriately setting materials and thicknesses of these layers interposed between the cathode and the anode, a red-, green- or blue-light emitting element can be obtained.

Figure 11B:
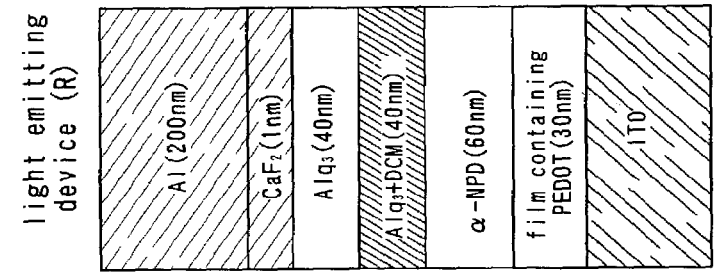

In the case where a red-light emitting element is to be obtained, as shown in FIG. 11B, a polymeric material PEDOT/PSS is applied on an anode made of ITO by spin coating, and then is baked under vacuum so as to obtain a film containing PEDOT whit a thickness of 30 nm. Next, a 4,4'-bis[N-(1-naphtyl)-N-phenyl-amino]-biphenyl (hereinafter, referred to as á-NPD) film is formed by vapor deposition to have a thickness of 60 nm. Next, a tris(8-quinolinolato)aluminum (hereinafter, referred to as $Alq_3$) film containing DCM is formed as a dopant by vapor deposition to have a thickness of 40 nm. Next, a film of $Alq_3$ is formed to have a thickness of 40 nm. Then, a $CaF_2$ film is formed by vapor deposition to have a thickness of 1 nm. As the final step, an Al film is formed to have a thickness of 200 nm by sputtering or vapor deposition to complete a red-light emitting element.

Figure 11C:
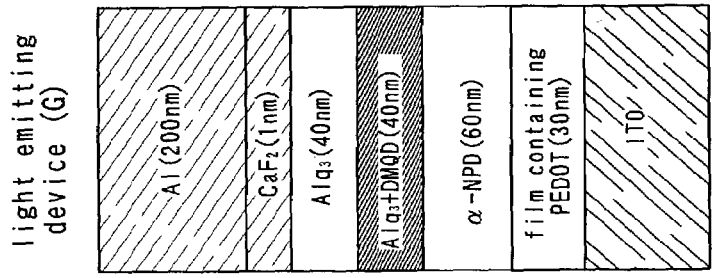

In the case where a green-light emitting element is to be obtained, as shown in FIG. 11C, a polymeric material PEDOT/PSS is applied on an anode made of ITO by spin coating, and then is baked under vacuum so as to obtain a film containing PEDOT whit a thickness of 30 nm. Next, an á-NPD film is formed by vapor deposition to have a thickness of 60 nm. Next, an $Alq_3$ film containing DMQD is formed as a dopant by vapor deposition to have a thickness of 40 nm. Next, a film of $Alq_3$ is formed to have a thickness of 40 nm. Then, a $CaF_2$ film is formed by vapor deposition to have a thickness of 1 nm. As the final step, an Al film is formed to have a thickness of 200 nm by sputtering or vapor deposition to complete a green-light emitting element.

Figure 11D:
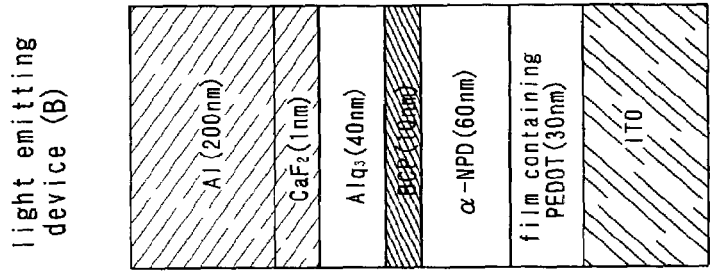

In the case where a blue-light emitting element is to be obtained, as shown in FIG. 11D, a polymeric material PEDOT/PSS is applied on an anode made of ITO by spin coating, and then is baked under vacuum so as to obtain a thickness of 30 nm. Next, an á-NPD film is formed by vapor deposition to have a thickness of 60 nm. Next, a basocuproine (hereinafter, referred to as BCP) film is formed as a dopant to have a thickness of 10 nm. Next, a film of $Alq_3$ is formed to have a thickness of 40 nm. Then, a $CaF_2$ film is formed by vapor deposition to have a thickness of 1 nm. As the final step, an Al film is formed to have a thickness of 200 nm by sputtering or vapor deposition to complete a blue-light emitting element.

In the case where the above-described colored light emitting elements (R, G, B) are to be formed, it is not necessary to provide a color filter. However, a color filter may be additionally provided to increase the color purity.

Moreover, Embodiment 1 may be combined with any one of Embodiment Modes 1 to 4.

[Embodiment 2]

Figure 12:
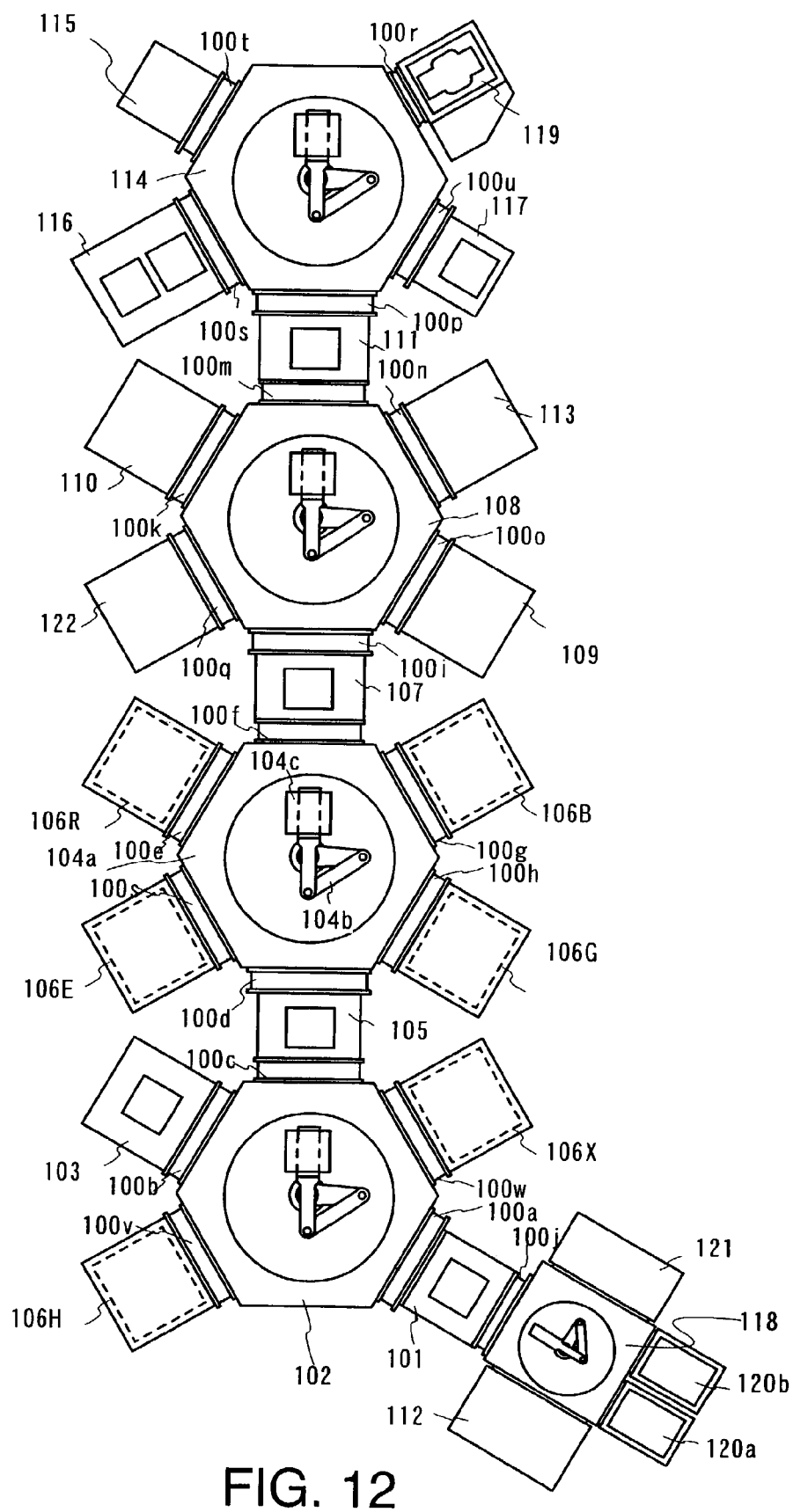
FIG. 12 is a diagram showing a manufacturing apparatus in Embodiment 2.

In Embodiment 2, an example of a multi-chamber system manufacturing apparatus, in which a manufacturing process from the formation of a light emitting element to the sealing is automated, is shown in FIG. 12.

In FIG. 12, a manufacturing apparatus includes: gates 100a to 100k and 100m and 100w, a charging chamber 101, a pick-up chamber 119, carrier chambers 102, 104a, 108, 114 and 118, delivery chambers 105, 107 and 111, film formation chambers 106R, 106B, 106G, 106H, 106E, 106X, 109, 110, 112 and 113, a pre-processing chamber 103, a sealing substrate loading chamber 117, a dispenser chamber 115, a sealing chamber 116, cassette chambers 120a and 120b, a tray attachment stage 121, and a plasma-etching chamber 122.

First, a plurality of TFTs, an anode (first electrode) made of a transparent conductive film (ITO (an alloy of indium oxide and tin oxide), an alloy of indium oxide and zinc oxide ($In_2O_3$—ZnO), zinc oxide (ZnO) and the like) deposited thereon, and an insulator for covering ends of the anode are provided in advance on a substrate. Then, a poly(ethylene dioxythiophene)/poly(styrene sulfonic acid) solution (PEDOT/PSS) acting as a hole injection layer is formed on the entire surface of the substrate. Then, a heating process in a vacuum is conducted so as to vaporize water. If it is necessary to clean or polish the surface of the anode, this cleaning or polishing process may be performed prior to the formation of the film containing PEDOT.

Hereinafter, a method for carrying the substrate, on which the anode, the insulator for covering the ends of the anode, and the hole injection layer (film containing PEDOT) are provided in advance, into the manufacturing apparatus shown in FIG. 12 so as to form a laminate structure shown in FIG. 9B will be described below.

First, the substrate is set in any one of the cassette chamber 120a and 120b. In the case where the substrate is large in size (for example, 300 mm×360 mm), the substrate is set in the cassette chamber 120b. On the other hand, in the case where the substrate is a normal substrate (for example, 127 mm×127 mm), the substrate is carried to the tray attachment stage 121 where a plurality of substrates are placed on a tray (for example, 300 mm×360 mm in size).

Next, the substrate is carried from the cassette chamber 120b to the carrier chamber 118 equipped with a substrate carrier mechanism. Next, the substrate is carried to the film formation chamber 112 where an layer containing an organic compound made of a polymer acting as a light emitting layer is formed on the entire surface of the hole injection layer (film containing PEDOT) provided on the entire surface of the substrate. The film formation chamber 112 is for forming the layer containing an organic compound made of a polymer. In this embodiment, an example where a polyvinyl carbazole (PVK) solution doped with a dye acting as a light emitting layer (1,1,4,4-tetraphenyl-1,3-butadiene (TPB), 4-dicyanomethylene-2-methyl-6(p-dimethylamino-styryl)-4H-pyran (DCM1), Nile Red, coumarin 6 or the like) is formed on the entire surface, will be shown. In the case where the layer containing an organic compound is to be formed by spin coating in the film formation chamber 112, a surface of the substrate, on which a film is to be formed, is set so as to be upwardly oriented under an atmospheric pressure. Moreover, after the formation of a film using water or an organic solution as a solvent, it is preferred to vaporize water by performing a heating processing in a vacuum. For this purpose, an annealing chamber connected to the film formation chamber 112, in which the heating under vacuum can be conducted, can be provided.

Next, the substrate is carried from the carrier chamber 118 equipped with the substrate carrier mechanism to the charging chamber 101.

The charging chamber 101 is connected to a vacuum pumping processing chamber. After the vacuum pumping, it is preferred to introduce an inert gas so that the charging chamber 101 is at an atmospheric pressure. Next, the substrate is carried to the carrier chamber 102 connected to the charging chamber 101. The vacuum pumping is performed so that water or oxygen is not present as much as possible in the carrier chamber to maintain the vacuum.

The carrier chamber 102 is connected to the vacuum pumping processing chamber for evacuating the carrier chamber. As the vacuum pumping processing chamber, a magnetic levitated type turbo molecular pump, a cryopump, or a dry pump is provided. With this vacuum pumping processing chamber, it is possible to set an ultimate degree of vacuum of the carrier chamber at $10^{-5}$ to $10^{-6}$ Pa.

Furthermore, it is possible to control the back diffusion of an impurity from the pump side or an exhaust system. In order to prevent an impurity from being introduced into the interior of the apparatus, an inert gas such as nitrogen or a rare gas is used as a gas to be introduced. As the gas to be introduced into the apparatus, a gas with a high purity provided by a gas purification machine before being introduced into the apparatus is used. Therefore, it is necessary to provide a gas purification machine so that the gas is introduced into the film formation apparatus after the purity of the gas is increased. As a result, since oxygen, water or other impurities contained in the gas can be removed in advance, these impurities can be prevented from being introduced into the apparatus.

After the film is formed by using water or an organic solution as a solvent, it is preferable that the substrate is carried to the pre-processing chamber 103 where a heating processing is performed in a high vacuum so as to further vaporize the water.

In this embodiment, an example where the layer containing an organic compounds, each being made of a polymeric material, are laminated is described. In the case where a laminate structure composed of a layer made of a polymeric material and a layer made of a monomeric material is to be formed as shown in FIG. 9C or 11A to 11D, films are appropriately formed in the film formation chamber 106R, 106G and 106B by vapor deposition, so that the layer containing an organic compounds emitting white light, or red, green or blue light as a whole of the light emitting element are appropriately formed. The delivery chamber 105 is equipped with a substrate reversing mechanism for appropriately reversing the substrate.

Moreover, the electron transport layer or the electron injection layer may be appropriately formed in the film formation chamber 106E, whereas the hole injection layer or the hole transport layer may be appropriately formed in the film formation chamber 106H, if needed. In the case where the vapor deposition is employed, the vapor deposition is performed in the film formation chamber which is evacuated to a degree of vacuum of $5×10^{-3}$ Torr (0.665 Pa) or lower, preferably, $10^{-4}$ to $10^{-6}$ Pa. In vapor deposition, the organic compound is vaporized in advance by resistance heating. A shutter (not shown) is opened upon vapor deposition, so that the organic compound is scattered in a direction of the substrate. The vaporized organic compound is upwardly scattered to pass through an opening (not shown) provided through a metal mask (not shown) so as to be vapor-deposited on the substrate. In vapor deposition, a temperature ($T_1$) of the substrate is set at 50 to 200° C., preferably, 65 to 150° C. by means of heating the substrate. Moreover, in the case where the vapor deposition is employed, it is preferred to set a crucible, in which a vapor-deposition material is received in advance by a material manufacturer, in the film formation chamber. Upon setting the crucible, it is preferred to set the crucible without contacting the atmosphere. Moreover, in delivery from a material manufacturer, it is preferred to introduce the crucible into the film formation chamber while being sealed within a second container. Desirably, a chamber having vacuum pumping means is provided so as to be in connection with the film formation chamber 106R. After the crucible is picked up from the second container in a vacuum or an inert gas atmosphere within this chamber, the crucible is installed in the film formation chamber. As a result, the crucible and an EL material received therein can be prevented from being contaminated.

Next, the substrate is carried from the carrier chamber 102 to the delivery chamber 105, then to the carrier chamber 104a, further to the delivery chamber 107 so as not to contact the atmosphere. Thereafter, the substrate is carried from the delivery chamber 107 to the carrier chamber 108 so as not to contact the atmosphere.

Next, the substrate is carried, by the carrier mechanism provided in the carrier chamber 108, to the film formation chamber 110 where a cathode (a second electrode) formed of a metal film (a film made of an alloy such as MgAg, MgIn, AlLi, $CaF_2$ or CaN, or a film formed by co-depositing an element belonging to Group I or Group II of the periodic table and aluminum) is formed by vapor deposition employing resistance heating. Upon the vapor deposition, a vapor deposition mask is used to selectively form the cathode.

Next, the substrate is carried to the plasma processing chamber 122 by the carrier mechanism set within the carrier chamber 108 so as to remove layer containing an organic compound made of a polymeric material in a self-aligned manner using the second electrode as a mask. The plasma processing chamber 122 has plasma generator means for exciting one or plurality of gases selected from the group consisting of Ar, H, F and O to generate a plasma for performing the dry etching. If the etching is performed by using the oxygen plasma processing, it is also possible to perform the oxygen plasma processing in the pre-processing chamber 103.

Next, the substrate is carried to the film formation chamber 110 again where a third electrode (corresponding to the upper layer of the cathode) made of a metal film (a film made of an alloy such as MgAg, MgIn, AlLi or CaN, or a film formed by co-depositing an element belonging to Group I or Group II of the periodic table and aluminum) is formed by vapor deposition using resistance heating. In this case, the third electrode is formed by a mask different from a vapor deposition mask made of a metal film which is used for the previous vapor deposition, for electrical connection of the second electrode and the connection wiring. Although the example where the second electrode and the third electrode are formed in the same film formation chamber 110 is described herein, the efficiency is lowered because it is necessary to replace a mask by another one. Therefore, in order to improve the task, it is preferred to separately provide film formation chambers for the respective electrodes. Although the example where the third electrode is selectively formed by using a vapor-deposition mask is described in this embodiment, the third electrode may also be patterned by etching with a photoresist after formation of the metal film by sputtering.

As a result of the above steps, a light emitting element having a laminate structure shown in FIG. 9B is formed.

Next, the light emitting element is carried from the carrier chamber 108 to the film formation chamber 113 without contacting the atmosphere, where a protective film made of a silicon nitride film or a silicon oxynitride film is formed. Herein, a sputtering device including a target made of silicon, silicon oxide or silicon nitride is provided in the film formation chamber 113. For example, an ambient in the film formation chamber can be made to be a nitrogen ambient or an ambient containing nitrogen and argon by using a target made of silicon so as to form a silicon nitride film.

Next, the substrate on which the light emitting element is formed is carried from the carrier chamber 108 to the delivery chamber 111, then to the carrier chamber 114, so as not to contact the atmosphere.

Next, the substrate, on which the light emitting element is formed, is carried from the carrier chamber 114 to the sealing chamber 116. Note that, it is preferred to prepare a sealing substrate, on which a sealing material is provided, in the sealing chamber 116.

The sealing substrate is set in the sealing substrate loading chamber 117 from the exterior. It is preferred to perform annealing in a vacuum in advance, for example, to perform annealing within the sealing substrate loading chamber 117, so as to remove an impurity such as water. Then, in the case where a sealing material is to be formed on the sealing substrate, the carrier chamber 114 is set at an atmospheric pressure. Thereafter, the sealing substrate is carried from the sealing substrate loading chamber 117 to the dispenser chamber 115 where the sealing material for attachment with the substrate including the light emitting element provided thereon is formed. Then, the sealing substrate, on which the sealing material is formed, is carried to the sealing chamber 116.

Next, in order to degas the substrate on which the light emitting element is provided, the annealing is performed in a vacuum or an inert ambient. Thereafter, the sealing substrate, on which the sealing material is provided, and the substrate, on which the light emitting element is formed, are bonded to each other. The sealed space is filled with hydrogen or an inert gas. Although the example where the sealing material is formed on the sealing substrate is described herein, the region where the sealing material is provided is not particularly limited thereto. The sealing material may be formed on the substrate on which the light emitting element is formed.

Next, a pair of the bonded substrates are irradiated with UV light by a ultraviolet-ray irradiation mechanism provided in the sealing chamber 116 so as to cure the sealing material. Although a ultraviolet curable resin is used as the sealing material herein, the type of the sealing material is not particularly limited as long as the sealing material is an adhesive.

Next, a pair of the bonded substrates are carried from the sealing chamber 116 to the carrier chamber 114, then to the pick-up chamber 119 where the bonded substrates are picked up.

As described above, the light emitting element is not exposed to the exterior owing to the manufacturing apparatus shown in FIG. 12 until the light emitting element is completely sealed within a sealed space. Therefore, it is possible to manufacture a highly reliable light emitting device. A nitrogen ambient in vacuum and that at an atmospheric pressure are alternated in the carrier chamber 114, whereas it is desirable to always keep the vacuum in the carrier chambers 102, 104a and 108.

Alternatively, the film formation apparatus may also be constituted as an inline system apparatus.

A procedure for carrying a substrate into the manufacturing apparatus shown in FIG. 12 so as to form a light emitting element having an opposite light emission direction to that of the above-described laminate structure by using a metal film (a metal having a large work function (Pt, Cr, W, Ni, Zn, Sn, In or the like) as an anode will be described below.

First, a poly(ethylene dioxythiophene)/poly(styrene sulfonic acid) solution (PEDOT/PSS) acting as a hole injection layer is formed on the entire surface of the substrate on which a plurality of TFTs, the anode, and the insulator for covering the ends of the anode are provided in advance. Then, a heating process is performed in a vacuum so as to vaporize the water.

Next, the substrate, on which the TFTs and the anode are provided, is set in either the cassette chamber 120a or 120b.

Then, the substrate is carried from the cassette chamber 120a or 120b to the carrier chamber 118 equipped with the substrate carrier mechanism.

Next, the substrate is carried to the film formation chamber 112 where the layer containing an organic compound made of a polymer serving as a light emitting layer is formed on the entire surface of the hole injection layer (a film containing PEDOT) which is formed on the entire surface of the substrate. The film formation chamber 112 is for forming the layer containing an organic compound made of a polymer. In this embodiment, an example where a polyvinyl carbazole (PVK) solution doped with a dye acting as a light emitting layer (1,1,4,4-tetraphenyl-1,3-butadiene (TPB), 4-dicyanomethylene-2-methyl-6(p-dimethylamino-styryl)-4H-pyran (DCM1), Nile Red, coumarin 6 or the like is formed on the entire surface of the hole injection layer is described. In the case where the layer containing an organic compound is to be formed by spin coating in the film formation chamber 112, the substrate is set under the atmospheric pressure so that its face on which the film is to be formed is upwardly oriented.

Next, the substrate is carried from the carrier chamber 118 equipped with the substrate carrier mechanism to the charging chamber 101. Then, the substrate is carried to the carrier chamber 102 connected to the charging chamber 101. After the film is formed by using water or an organic solution as a solvent, it is preferred that the substrate is carried to the pre-processing chamber 103 where a heating process is performed in a vacuum so as to vaporize the water.

Next, the substrate is carried from the carrier chamber 102 to the delivery chamber 105, then to the carrier chamber 104a, further to the delivery chamber 107 so as not to contact the atmosphere. Thereafter, the substrate is carried from the delivery chamber 107 to the carrier chamber 108 so as not to contact the atmosphere.

Next, the substrate is carried, by the carrier mechanism provided in the carrier chamber 108, to the film formation chamber 110 where a cathode (lower layer) formed of an extremely thin metal film (a film made of an alloy such as MgAg, MgIn, AlLi or CaN, or a film formed by co-depositing an element belonging to Group I or Group II of the periodic table and aluminum) is formed by vapor deposition employing resistance heating. After formation of the cathode (lower layer) made of a thin metal layer, the substrate is carried to the film formation chamber 109 where a cathode (upper layer) made of a transparent conductive film (ITO (an alloy of indium oxide and tin oxide), an alloy of indium oxide and zinc oxide ($In_2O_3$—ZnO), zinc oxide (ZnO) and the like) is formed by sputtering. Then, the cathode (second electrode) made of a laminate of a thin metal layer and a transparent conductive film is appropriately formed by using a metal mask and the like.

Next, the substrate is carried to the plasma processing chamber 122 by the carrier mechanism set within the carrier chamber 108 so as to remove the laminate layer of the organic compound films made of a polymeric material in a self-aligned manner using the second electrode as a mask. The plasma processing chamber 122 has plasma generator means for exciting one or plurality of gases selected from the group consisting of Ar, H, F and O to generate a plasma for performing the dry etching. If the etching is performed by using the oxygen plasma processing, it is also possible to perform the oxygen plasma processing in the pre-processing chamber 103.

Next, the substrate is carried to the film formation chamber 109 again where a third electrode (corresponding to the upper layer of the cathode) made of a transparent conductive film is formed by sputtering. In this case, the third electrode is formed by changing the metal mask with the pattern different from one used for the previously formed second electrode, for electrical connection between the second electrode and the connection wiring. Although an example where the third electrode is selectively formed by using a mask is described in Embodiment 2, the third electrode may also be patterned by etching with a photoresist.

By the above-described steps, the light emitting element, from which light transmitted through the second electrode is obtained, is formed.

Moreover, since the subsequent steps are the same as those in the above-described manufacturing procedure for the light emitting device having a laminate structure shown in FIG. 9B, the description thereof is herein omitted.

Although the example where the method described in Embodiment 4 for electrically connecting the second electrode and the connection wiring to each other by forming the third electrode has been described in this embodiment, a method for electrically connecting the second electrode and the connection wiring to each other is not particularly limited thereto. The second electrode and the connection wiring may be connected to each other by any one of the methods described in Embodiment Modes 1 to 3.

Moreover, this embodiment can be freely combined with Embodiment 1.

[Embodiment 3]

By implementing the present invention, all of the electronic appliances into which a module including organic light emitting elements (an active matrix EL module) is built is completed.

Following can be given as such electronic appliances: video cameras; digital cameras; head mounted displays (goggle type displays); car navigation systems; projectors; car stereos; personal computers; portable information terminals (mobile computers, mobile phones or electronic books etc.) etc. Examples of these are shown in FIGS. 13A to 13F and 14A to 14C.

Figure 13A:
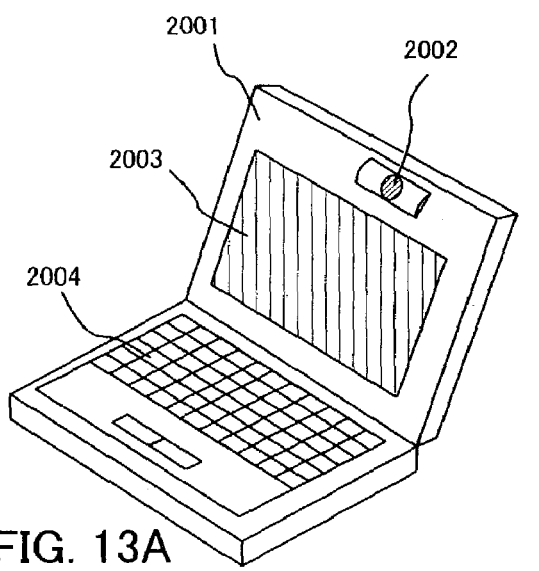
FIGS. 13A to 13F, each showing an example of electronic appliances in Embodiment 3.

FIG. 13A is a personal computer which comprises: a main body 2001; an image input section 2002; a display section 2003; and a keyboard 2004 etc.

Figure 13B:
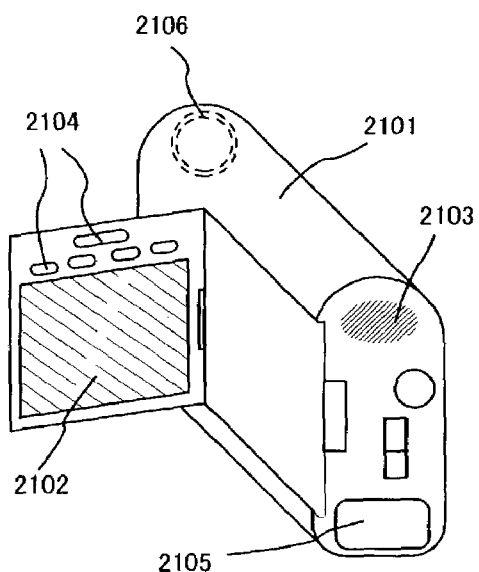

FIG. 13B is a video camera which comprises: a main body 2101; a display section 2102; a voice input section 2103; operation switches 2104; a battery 2105 and an image receiving section 2106 etc.

Figure 13C:
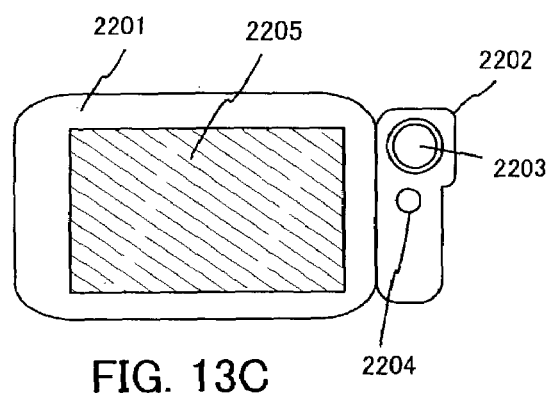

FIG. 13C is a mobile computer which comprises: a main body 2201; a camera section 2202; an image receiving section 2203; operation switches 2204 and a display section 2205 etc.

Figure 13D:
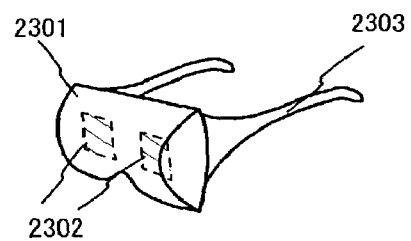

FIG. 13D is a goggle type display which comprises: a main body 2301; a display section 2302; and an arm section 2303 etc.

Figure 13E:
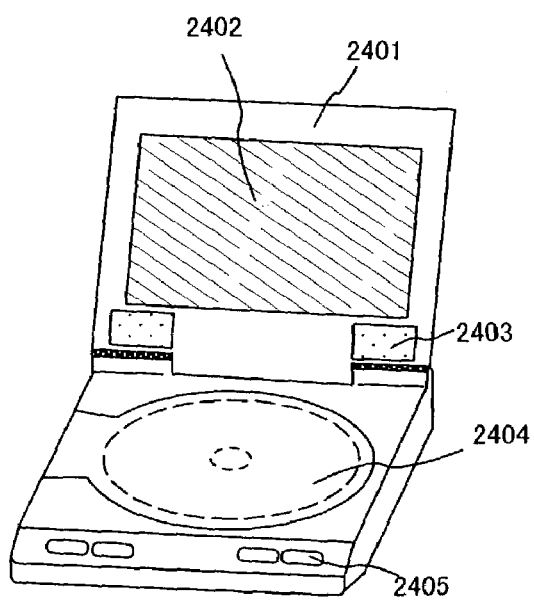

FIG. 13E is a player using a recording medium in which a program is recorded (hereinafter referred to as a recording medium) which comprises: a main body 2401; a display section 2402; a speaker section 2403; a recording medium 2404; and operation switches 2405 etc. This apparatus uses DVD (digital versatile disc), CD, etc. for the recording medium, and can perform music appreciation, film appreciation, games and use for Internet.

Figure 13F:
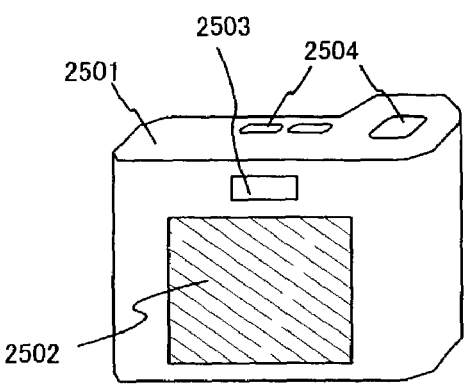

FIG. 13F is a digital camera which comprises: a main body 2501; a display section 2502; a view finder 2503; operation switches 2504; and an image receiving section (not shown in the FIG.) etc.

Figure 14A:
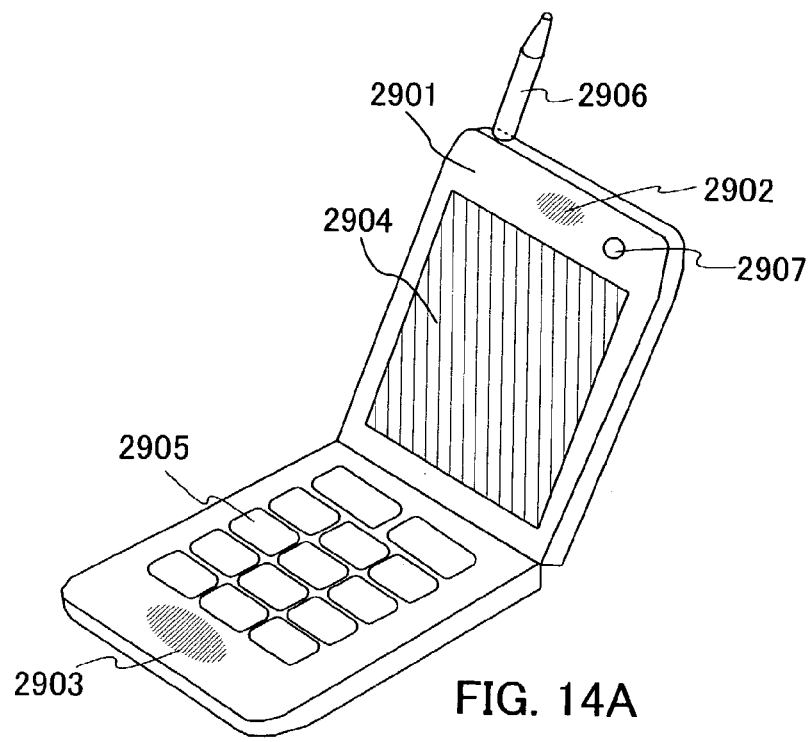
FIGS. 14A to 14C, each showing an example of electronic appliances in Embodiment 3.

FIG. 14A is a mobile phone which comprises: a main body 2901; a voice output section 2902; a voice input section 2903; a display portion 2904; operation switches 2905; an antenna 2906; and an image input section (CCD, image sensor, etc.) 2907 etc.

Figure 14B:
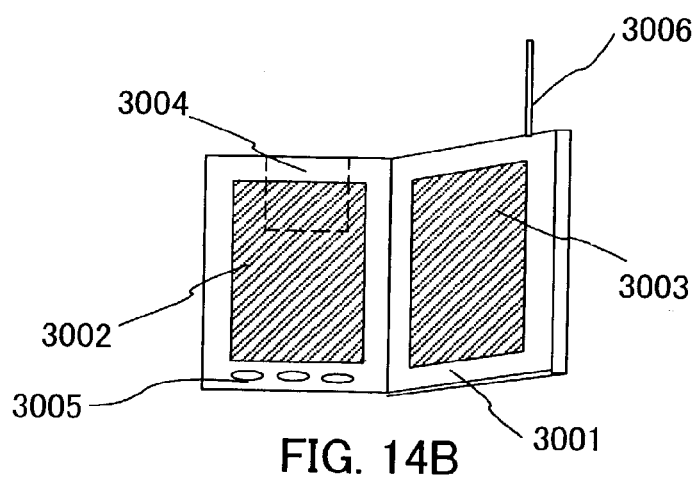

FIG. 14B is a portable book (electronic book) which comprises: a main body 3001; display portions 3002 and 3003; a recording medium 3004; operation switches 3005 and an antenna 3006 etc.

Figure 14C:
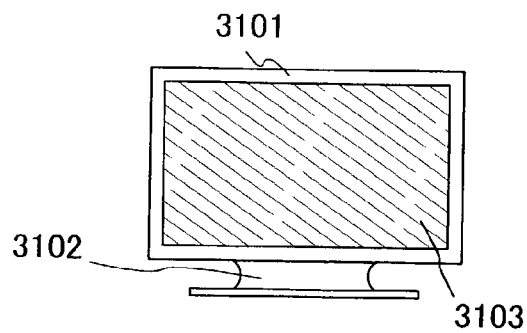

FIG. 14C is a display which comprises: a main body 3101; a supporting section 3102; and a display portion 3103 etc.

In addition, the display shown in FIG. 14C has small and medium-sized or large-sized screen, for example a size of 5 to 20 inches. Further, it is preferable to mass-produce by executing a multiple pattern using a substrate sized 1 m×1 m to form such sized display portion.

As described above, the applicable range of the present invention is extremely large, and the invention can be applied to electronic appliances of various areas. Note that the electronic appliances of this embodiment can be achieved by utilizing any combination of constitutions in Embodiment Modes 1 to 4, and Embodiments 1 and 2.

[Embodiment 4]

Figure 19A:
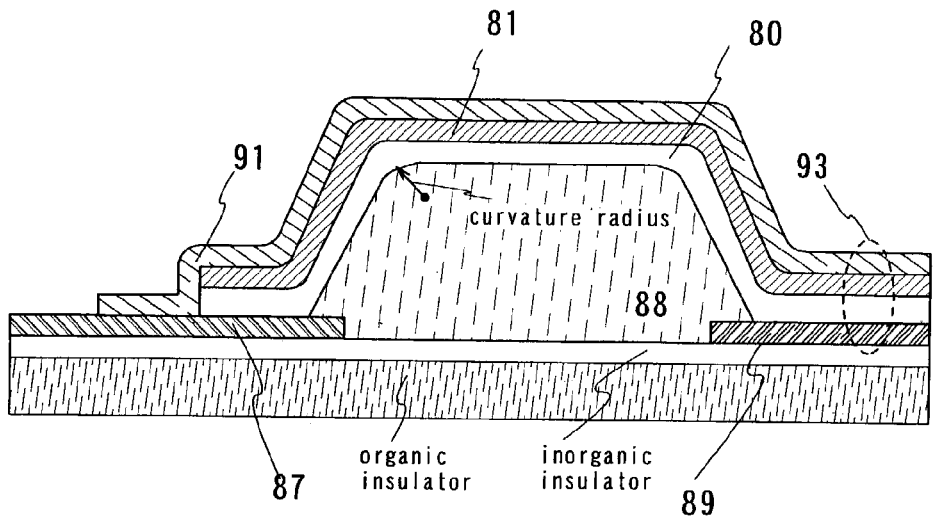
FIGS. 19A to 19C are cross-sectional views of Embodiment 4.
Figure 19B:
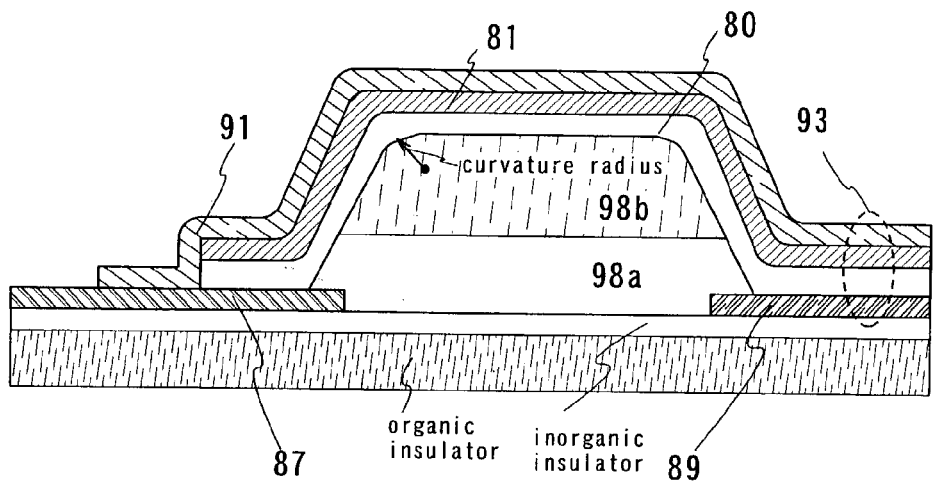
Figure 19C:
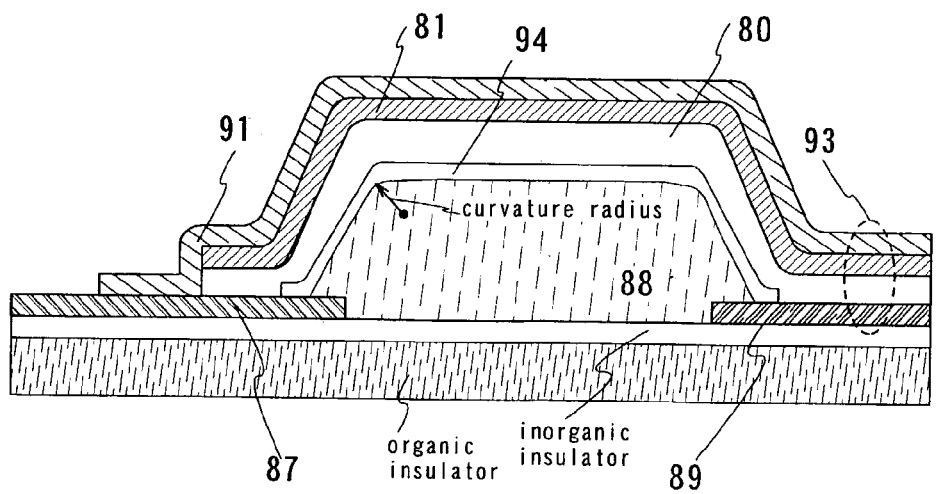

Although an example of the insulator having the first and second curvature radii has been described in Embodiment Mode 4, an example where only the upper end of the insulator has a curvature radius is shown in FIGS. 19A to 19C in this embodiment.

Although a structure other than the insulator is the same as that of Embodiment Mode 4 in this embodiment, the structure is not particularly limited thereto. Instead of the insulators shown in Embodiment Modes 1 to 3, the insulator shown in this embodiment can be applied.

In FIGS. 19A to 19C, a light emitting device includes an layer 80 containing an organic compound, a second electrode 81, a connection wiring 87, an insulator 88, a first electrode 89, a third electrode 91, and a light emitting device 93. As the insulator 88, it is preferred to use a negative type organic material which is rendered insoluble to an etchant by light or a positive type organic material which is rendered soluble to an etchant by light.

Figure 20:
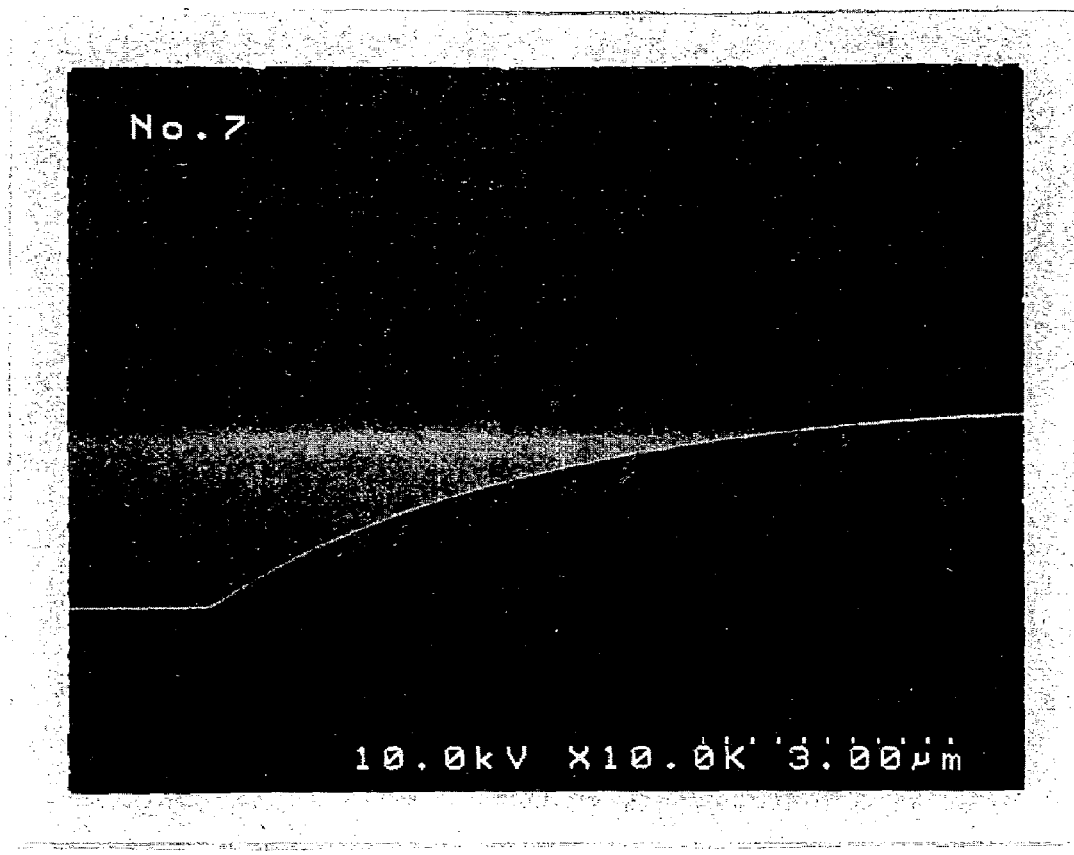
FIG. 20 is a photographic view showing a cross section of the periphery of an insulator.

In this embodiment, the insulator 88 is formed by a positive-type photoresist. The insulator 88 shown in FIG. 19A is formed by adjusting the exposure conditions or etchant conditions. The insulator 88 has a curvature radius of 0.2 to 3 μm only on its upper end. The insulator 88 can provide good coverage for the layer 80 containing an organic compound or the second electrode 81 made of a metal film. At the same time, the defect called shrink, i.e., reduction in light emitting area, can be reduced. The same shape as that of the insulator 88 shown in FIG. 19A is formed on a glass substrate by using a positive type acrylic resin. A photograph of its cross section obtained through observation of the acrylic resin is shown in FIG. 20. A taper angle on the side face of the insulator 88 may be 45°±10°.

Moreover, FIG. 19B shows an example where a laminate layer composed of an upper layer 98b made of a photoresist serving as a photosensitive organic material and a lower layer 98a made of acrylic serving as a non-photosensitive organic material is used as the insulator. The upper layer 98b of the insulator has a curvature radius of 0.2 to 3 μm only on its upper end. Instead of using the non-photosensitive material, an inorganic material (silicon oxide, silicon nitride, silicon oxynitride or the like) can be used as the lower layer 98a of the insulator.

FIG. 19C shows an example where a silicon nitride film 94 is formed by RF sputtering on the insulator 88. Instead of using the silicon nitride film 94, a silicon oxynitride film or a film represented by $AlN_XO_Y$ can be used. The film represented by $AlN_XO_Y$ may be formed by sputtering using a target made of AlN or Al while introducing oxygen, nitrogen or a rare gas from the gas introduction system. It is sufficient for the film represented by $AlN_XO_Y$ to contain nitrogen at several atm % or more, preferably, 2.5 atm % to 47.5 atm % and oxygen at 47.5 atm % or less, preferably, 0.01 to less than 20 atm %. The protective film such as a silicon nitride film is formed on the insulator 88, so that a defect called shrink, i.e., reduction in light emitting area, can be reduced.

Moreover, this embodiment can be combined with any one of Embodiment Modes 1 to 4 and Embodiments 1 to 3.

According to the present invention, an layer containing an organic compound can be selectively formed. As a result, a structure, in which the layer containing an organic compound is not formed at a junction of a wiring connected to the external power source, can be easily formed.

Moreover, according to the present invention, the color filter is provided to eliminate the necessity of a circular polarizing plate so as to reduce the cost. At the same time, since it is not necessary to separately color the light emitting elements owing to the color filter, the improvement in throughput as well as in definition can be realized.

What is claimed is:

1. A light emitting device comprising:
    a pixel portion including a plurality of light emitting elements, and a terminal portion, between a first substrate having an insulating surface and a second substrate having translucency,
    each of the light emitting elements including: a first electrode; a layer containing an organic compound on the first electrode; and a second electrode on the layer containing the organic compound, and
    a wiring electrically connected to the terminal portion,
    wherein the first substrate and the second substrate are bonded to each other through an adhesive in which conductive fine particles having different diameters are mixed,
    wherein the second electrode and the wiring are electrically connected to each other through the adhesive.

2. A light emitting device according to claim 1, wherein the second electrode is one of an anode and a cathode.

3. A light emitting device according to claim 1, wherein the second electrode has the same pattern form as that of the layer containing the organic compound.

4. A light emitting device according to claim 1, wherein the organic compound is made of a polymeric material.

5. A light emitting device according to claim 1, wherein the layer containing the organic compound comprises a layer made of a polymeric material and a layer made of a monomeric material.

6. A light emitting device according to claim 1, wherein an end of the first electrode is covered with an insulator, an upper end of the insulator includes a curved surface having a first curvature radius, a lower end of the insulator includes a curved surface having a second curvature radius, and each of the first curvature radius and the second curvature radius is 0.2 to 3 μm.

7. A light emitting device according to claim 1, wherein the first electrode is made of a material having translucency, and is one of an anode and a cathode.

8. A light emitting device according to claim 1, wherein the light emitting elements emit white light, and further comprising color filters.

9. A light emitting device according to claim 1, wherein the light emitting elements emit monochromatic light, and further comprising color converting layers or colored layers.

10. A light emitting element according to claim 1, wherein the light emitting device is any one of a video camera, a digital camera, a goggle-type display, a car navigation system, a personal computer and a portable information terminal.

11. A light emitting device comprising:
a pixel portion including a plurality of light emitting elements, and a terminal portion, between a first substrate having an insulating surface and a second substrate having translucency,
each of the light emitting elements including: a first electrode; a layer containing an organic compound on the first electrode; and a second electrode on the layer containing the organic compound, and
a wiring electrically connected to the terminal portion,
wherein the first substrate and the second substrate are bonded to each other through an adhesive in which a fine particle made of an inorganic material and a conductive fine particle having a larger diameter than that of the fine particle are mixed,
wherein the second electrode and the wiring are electrically connected to each other through the adhesive.

12. A light emitting device according to claim 11, wherein the second electrode is one of an anode and a cathode.

13. A light emitting device according to claim 11, wherein the second electrode has the same pattern form as that of the layer containing the organic compound.

14. A light emitting device according to claim 11, wherein the organic compound is made of a polymeric material.

15. A light emitting device according to claim 11, wherein the layer containing the organic compound comprises a layer made of a polymeric material and a layer made of a monomeric material.

16. A light emitting device according to claim 11, wherein an end of the first electrode is covered with an insulator, an upper end of the insulator includes a curved surface having a first curvature radius, a lower end of the insulator includes a curved surface having a second curvature radius, and each of the first curvature radius and the second curvature radius is 0.2 to 3 µm.

17. A light emitting device according to claim 11, wherein the first electrode is made of a material having translucency, and is one of an anode and a cathode.

18. A light emitting device according to claim 11, wherein the light emitting elements emit white light, and further comprising color filters.

19. A light emitting device according to claim 11, wherein the light emitting elements emit monochromatic light, and further comprising color converting layers or colored layers.

20. A light emitting element according to claim 11, wherein the light emitting device is any one of a video camera, a digital camera, a goggle-type display, a car navigation system, a personal computer and a portable information terminal.

21. A light emitting device comprising:
a pixel portion including a plurality of light emitting elements, between a first substrate and a second substrate,
each of the light emitting elements including: a first electrode; a layer containing an organic compound on the first electrode; and a second electrode on the layer containing the organic compound;
a terminal portion, and
a wiring electrically connected to the terminal portion,
wherein the first substrate and the second substrate are bonded with a sealer,
wherein an end face of the layer containing the organic compound is flush with that of the second electrode; and
wherein the second electrode and the wiring are electrically connected through an adhesive containing a conductive fine particle.

22. A light emitting device according to claim 21, wherein the second electrode is one of an anode and a cathode.

23. A light emitting device according to claim 21, wherein the organic compound is made of a polymeric material.

24. A light emitting device according to claim 21, wherein the layer containing the organic compound comprises a layer made of a polymeric material and a layer made of a monomeric material.

25. A light emitting device according to claim 21, wherein an end of the first electrode is covered with an insulator, an upper end of the insulator includes a curved surface having a first curvature radius, a lower end of the insulator includes a curved surface having a second curvature radius, and each of the first curvature radius and the second curvature radius is 0.2 to 3 µm.

26. A light emitting device according to claim 21, wherein the first electrode is made of a material having translucency, and is one of an anode and a cathode.

27. A light emitting device according to claim 21, wherein the light emitting elements emit white light, and further comprising color filters.

28. A light emitting device according to claim 21, wherein the light emitting elements emit monochromatic light, and further comprising color converting layers or colored layers.

29. A light emitting element according to claim 21, wherein the light emitting device is any one of a video camera, a digital camera, a goggle-type display, a car navigation system, a personal computer and a portable information terminal.

30. A light emitting device comprising:
a pixel portion including a plurality of light emitting elements,
each of the light emitting elements including: a first electrode; a layer containing an organic compound on the first electrode; and a second electrode on the layer containing the organic compound;
a third electrode over the second electrode,
a terminal portion, and
a wiring electrically connected to the terminal portion,
wherein an end face of the layer containing the organic compound is flush with that of the second electrode; and
wherein the second electrode and the wiring are connected through the third electrode.

31. A light emitting device according to claim 30, wherein the third electrode is made of a metal.

32. A light emitting device according to claim 30, wherein the second electrode is one of an anode and a cathode.

33. A light emitting device according to claim 30, wherein the organic compound is made of a polymeric material.

34. A light emitting device according to claim 30, wherein the layer containing the organic compound comprises a layer made of a polymeric material and a layer made of a monomeric material.

35. A light emitting device according to claim 30, wherein an end of the first electrode is covered with an insulator, an upper end of the insulator includes a curved surface having a first curvature radius, a lower end of the insulator includes a curved surface having a second curvature radius, and each of the first curvature radius and the second curvature radius is 0.2 to 3 μm.

36. A light emitting device according to claim 30, wherein the first electrode is made of a material having translucency, and is one of an anode and a cathode.

37. A light emitting device according to claim 30, wherein the light emitting elements emit white light, and further comprising color filters.

38. A light emitting device according to claim 30, wherein the light emitting elements emit monochromatic light, and further comprising color converting layers or colored layers.

39. A light emitting element according to claim 30, wherein the light emitting device is any one of a video camera, a digital camera, a goggle-type display, a car navigation system, a personal computer and a portable information terminal.

40. A light emitting device according to claim 1, further comprising a driving circuit.

41. A light emitting device according to claim 1, wherein the second electrode is not in contact with the wiring.

42. A light emitting device according to claim 1, wherein the terminal portion is electrically connected to a flexible printed circuit.

43. A light emitting device according to claim 1, wherein the terminal portion is placed on the first substrate so as to be positioned outside the second substrate.

44. A light emitting device according to claim 11, further comprising a driving circuit.

45. A light emitting device according to claim 11, wherein the second electrode is not in contact with the wiring.

46. A light emitting device according to claim 11, wherein the terminal portion is electrically connected to a flexible printed circuit.

47. A light emitting device according to claim 11, wherein the terminal portion is placed on the first substrate so as to be positioned outside the second substrate.

48. A light emitting device according to claim 21, further comprising a driving circuit.

49. A light emitting device according to claim 21, wherein the second electrode is not in contact with the wiring.

50. A light emitting device according to claim 21, wherein the terminal portion is electrically connected to a flexible printed circuit.

51. A light emitting device according to claim 21, wherein the terminal portion is placed on the first substrate so as to be positioned outside the second substrate.

52. A light emitting device according to claim 21, further comprising a protective film over the second electrode and the adhesive.

53. A light emitting device according to claim 30, further comprising a driving circuit.

54. A light emitting device according to claim 30, wherein the third electrode is not in contact with the wiring.

55. A light emitting device according to claim 30, wherein the terminal portion is electrically connected to a flexible printed circuit.

* * * * *